US007608200B2

(12) United States Patent  
Seto et al.

(10) Patent No.: US 7,608,200 B2
(45) Date of Patent: Oct. 27, 2009

(54) PHOSPHOR AND INCLUDING THE SAME, LIGHT EMITTING APPARATUS, ILLUMINATING APPARATUS AND IMAGE DISPLAY

(75) Inventors: Takatoshi Seto, Yokohama (JP); Naoto Kijima, Yokohama (JP); Masahiko Yoshino, Yokohama (JP); Masayoshi Mikami, Yokohama (JP); Motoyuki Shigeiwa, Yokohama (JP); Hiroyuki Imura, Yokohama (JP)

(73) Assignee: Mitsubishi Chemical Corporation, Tokyo (JP)

( * ) Notice: Subject to any disclaimer, the term of this patent is extended or adjusted under 35 U.S.C. 154(b) by 141 days.

(21) Appl. No.: 10/586,397

(22) PCT Filed: Jan. 14, 2005

(86) PCT No.: PCT/JP2005/000726

§ 371 (c)(1),
(2), (4) Date: Jan. 10, 2007

(87) PCT Pub. No.: WO2005/068584

PCT Pub. Date: Jul. 28, 2005

(65) Prior Publication Data

US 2007/0158614 A1 Jul. 12, 2007

(30) Foreign Application Priority Data

Jan. 16, 2004 (JP) .............................. 2004-009768
Jan. 16, 2004 (JP) .............................. 2004-009769
Jan. 16, 2004 (JP) .............................. 2004-009770

(51) Int. Cl.
*H01L 33/00* (2006.01)
*H01S 5/18* (2006.01)
*H01S 5/323* (2006.01)
*C09K 11/59* (2006.01)
*C09K 11/62* (2006.01)
*C09K 11/64* (2006.01)
*C09K 11/66* (2006.01)

(52) U.S. Cl. ........................ 252/301.4 F; 252/301.6 F; 313/503; 257/98

(58) Field of Classification Search ........... 252/301.4 F, 252/301.6 F; 313/503; 257/98
See application file for complete search history.

(56) References Cited

U.S. PATENT DOCUMENTS

| 3,544,482 | A |  | 12/1970 | Barry |
| 5,951,959 | A |  | 9/1999 | Nishimura |
| 6,278,135 | B1 |  | 8/2001 | Srivastava et al. |
| 6,294,800 | B1 |  | 9/2001 | Duggal et al. |
| 6,466,135 | B1 |  | 10/2002 | Srivastava et al. |
| 6,850,002 | B2 | * | 2/2005 | Danielson et al. ........... 313/501 |
| 6,982,045 | B2 | * | 1/2006 | Menkara et al. ....... 252/301.4 F |
| 7,026,755 | B2 | * | 4/2006 | Setlur et al. ................. 313/501 |
| 7,077,979 | B2 | * | 7/2006 | Cheetham et al. ...... 252/301.4 R |
| 2002/0063301 | A1 |  | 5/2002 | Hanamoto et al. |
| 2004/0056256 | A1 |  | 3/2004 | Bokor et al. |

FOREIGN PATENT DOCUMENTS

| CN | 1194292 A | 9/1998 |
| EP | 1 484 803 A1 | 12/2004 |
| GB | 1199541 | 7/1970 |
| JP | 2002 509978 | 4/2002 |
| JP | 2002 332481 | 11/2002 |
| JP | 2003 261868 | 9/2003 |
| JP | 2003 306675 | 10/2003 |
| JP | 2003 313549 | 11/2003 |
| JP | 2004 2512 | 1/2004 |
| JP | 2004 501512 | 1/2004 |
| KR | 10 0306996 | 9/2001 |
| WO | 00 33389 | 6/2000 |
| WO | 02 11214 | 12/2002 |
| WO | WO 03/069686 | 8/2003 |
| WO | 2004 111156 | 12/2004 |
| WO | 2005 017066 | 2/2005 |

OTHER PUBLICATIONS

Barry, Thomas L.,"Fluorescence of $Eu^{2+}$- Activated Phases in Binary Alkaline Earth Orthosilicate Systems", J. Electrochem. Soc., vol. 115, No. 11, pp. 1181-1184, 1968.
Poort, S.H.M. et al.,"Optical Properties of $Eu^{2+}$—Activated Orthosilicates and Orthophosphates", Journal of Alloys and Compounds, vol. 260, pp. 93-97, 1997.
Park, Joung Kyu et al.,"White Light-Emitting Diodes of GaN-Based $Sr_2SiO_4$ : Eu and the Luminescent Properties", Applied Physics Letters, vol. 82, No. 5, pp. 683-685, 2003.
Kim, J. S. et al.,"Emission Color Variation of $M_2SiO_4:Eu^{2+}$ (M=Ba, Sr, Ca) Phosphors for White-Light-Emitting Diode", Solid State Communications, vol. 133, pp. 1-4, 2004.
Kim, Jong Su et al.,"Optical and Structural Properties of $Eu^{2+}$-Doped $(Sr_{1-x}Ba_x)_2SiO_4$ Phosphors", Journal of the Electrochemical Society., vol. 152, No. 9, pp. H135-H137, 2005.
Barry, Equilibria and $Eu^{2+}$ Luminescence of Subsolidus Phases Bounded by $Ba_3MgSi_2O_8$, $Sr_3MgSi_2O_8$, and $Ca_3MgSi_2O_8$, J. Electrochem. Soc.: Solid State Science, vol. 115, No. 7, pp. 733-739, 1968.
Kim et al., "Warm-White-Light Emitting Diode Utilizing a Single-Phase Full-Color $Ba_3MgSi_2O_8:Eu^{2+}$, $Mn^{2+}$ Phosphor", Applied Physics Letters, vol. 84, No. 15, pp. 2931-2933, 2004.

(Continued)

*Primary Examiner*—C. Melissa Koslow
(74) *Attorney, Agent, or Firm*—Oblon, Spivak, McClelland, Maier & Neustadt, L.L.P.

(57) ABSTRACT

An object of the present invention is to provide a high-efficiency red light emitting phosphor and white light emitting phosphor for using in a display or lighting which high-efficiently emits light in combination with a light source which emits light in the region from near-ultraviolet light to visible light. The present invention relates to a phosphor having a crystal phase having a specified chemical composition.

26 Claims, 11 Drawing Sheets

OTHER PUBLICATIONS

Barry, "Luminescent Properties of $Eu^{2+}$ and $Eu^{2+}+Mn^{2+}$ Activated $BaMg_2Si_2O_7$", J. Electrochem. Soc.: Solid State Science, vol. 117, No. 3, pp. 381-385, 1970.

Yao et al., "A Study on Photoluminescence of $Eu^{2+}$ and $Mn^{2+}$ in $Sr_3MgSi_2O_8$", Chemical Journal of Chinese Universities, vol. 18, No. 1, pp. 1-5, 1997 (with English Translation).

Blasse et al., "Fluorescence of $Eu^{2+}$-Activated Silicates", Philips Res. Repts., vol. 23, pp. 189-200, 1968.

Kim et al., "GaN-Based White-Light-Emitting Diodes Fabricated With a Mixture of $Ba_3MgSi_2O_8$: $Eu^{2+}$ and $Sr_2SiO_4$:$Eu^{2+}$Phosphors", Japanese Journal of Applied Physics, vol. 43, No. 3, pp. 989-992, 2004.

* cited by examiner

PHOSPHOR AND INCLUDING THE SAME, LIGHT EMITTING APPARATUS, ILLUMINATING APPARATUS AND IMAGE DISPLAY

TECHNICAL FIELD

The present invention relates to a high-efficiency light emitting device obtained by combining a light emitter which emits light in the region from near-ultraviolet light to visible light and a phosphor which absorbs this light and emits visible light having a longer wavelength, and the phosphor itself.

BACKGROUND ART

White light indispensable for displays and lighting is generally obtained by combining blue, green and red light emissions according to an addition mixing principle of light. In the displays, in order to efficiently reproduce colors in a wide range on chromaticity coordinates, it is necessary that blue, green and red phosphors have as high emission intensity as possible and good color purity. In general lighting, it becomes necessary that they have high emission efficiency, and that the color of an object irradiated looks like when it is irradiated with natural light, namely, that so-called color rendering properties are high, depending on some applications. In a fluorescent lamp which is typical lighting, an ultraviolet ray having a wavelength of 254 nm caused by discharge of mercury is mainly used as an excitation source, and three kinds of phosphors which emit lights of 450 nm, 540 nm and 610 nm highly sensitive for human eyes are mixed to use, thereby realizing light emission having high color rendering properties. However, when the wavelength of excitation light is in the region from near-ultraviolet light to visible light, no phosphor having high emission efficiency has been developed under the present situation. In particular, to the excitation light in this wavelength range, emission efficiency of the red phosphor is low compared to that of the blue and green phosphors, so that a red phosphor having excellent performance has been desired. When any two or three lights of the above-mentioned 450 nm, 540 nm and 610 nm are obtained from one phosphor, a blending process is simplified compared to mixing of three kinds of phosphors, and stability of performance is expected. However, it had not been realized.

Various phosphors which emit blue, green and red lights in combination with a light source of light emission in the region from near-ultraviolet light to visible light are exemplified in patent document 1. Of these, an alkaline earth metal silicate phosphor is described to emit light in a blue color and a red color. Further, in patent document 2, it is described that a (Ba, Ca, Sr, Mg)—Si—O system activated by $Eu^{2+}$ emits light at 505 nm in the case of only Ba and Ca, and that emission wavelength shifts to 580 nm when Sr is added. In non-patent document 1, there is a report about $(Ba, Ca, Sr)_3MgSi_2O_8$: Eu,Mn. Further, in non-patent document 2, it is described that $Ba_3MgSi_2O_8$:Eu,Mn has emission peaks at 442 nm, 505 nm and 620 nm, and that its crystal structure is merwinite.

[Patent Document 1]
JP-T-2004-505470 (the term JP-T as used herein means a published Japanese translation of a PCT patent application)
[Patent Document 2]
JP-T-2004-501512
[Non-Patent Document 1]
J. Electrochem. Soc., Vol. 115, No. 7, 733-738 (1968)
[Non-Patent Document 2]
Appl. Phys. Lett., Vol. 84, No. 15, 2931-2933 (2004)

DISCLOSURE OF THE INVENTION

An object of the invention is to develop a high-efficiency red light emitting phosphor and white phosphor for using in a display or lighting which high-efficiently emits light in combination with a light source which emits light in the region from near-ultraviolet light to visible light.

In order to solve the above-mentioned problem, the present inventors have made intensive studies. As a result, it has been found that an alkaline earth silicate phosphor having a novel composition and a specified crystal structure high-efficiently emits red or white light to excitation light in the region from near-ultraviolet light to visible light, thus completing the present invention.

Specifically, the present inventors have found a Ba- and Ca-containing $M_2SiO_4$ type silicate activated by Eu and Mn, thus arriving at the present invention. In particular, the red phosphor of the present invention has a wavelength of emission peak within the range of 590 nm to 620 nm, so that it is characterized by reddish emission which feels bright.

That is to say, a first gist of the present invention is a phosphor comprising a crystal phase having a chemical composition of the following formula [1], [2] or [3], and a second gist is a light emitting device comprising a first light emitter which emits light of 350 nm to 430 nm and a second light emitter which emits visible light by irradiation of light from the first light emitter, wherein the above-mentioned second light emitter is a phosphor comprising a crystal phase having a chemical composition of the following formula [1], [2] or [3]:

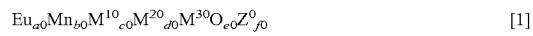  [1]

wherein $M^{10}$ is a divalent element containing 85 mol % or more of at least one element selected from the group consisting of Ba, Ca and Sr, in which the ratio (molar ratio) of Ca to the sum of Ba and Ca is from 0.1 to 0.9; $M^{20}$ represents at least one element selected from the group consisting of a monovalent, trivalent and pentavalent elements; $M^{30}$ represents a group of tetravalent elements containing Si and Ge in a total amount of 90 mol % or more; $Z^0$ is at least one element selected from the group consisting of a minus monovalent and minus divalent elements, H and N; and a0 is a number satisfying $0.001 \leq a0 \leq 0.6$, b0 is a number satisfying $0 \leq b0 \leq 0.7$, c0 and d0 are numbers satisfying $0 \leq d0/(c0+d0) \leq 0.2$, a0, b0, c0 and d0 are numbers satisfying $1.8 \leq (a0+b0+c0+d0) \leq 2.2$, and e0 and f0 are numbers satisfying $0 \leq f0/(e0+f0) \leq 0.035$ and $3.6 \leq (e0+f0) \leq 4.4$.

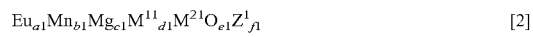  [2]

wherein $M^{11}$ represents at least one element selected from the group consisting of a monovalent element, a divalent element except Eu, Mn and Mg, a trivalent element and a pentavalent element, in which the proportion of the divalent element is 80 mol % or more, the proportion of the sum of Ba, Ca and Sr is 40 mol % or more, and the ratio (molar ratio) of Ca to the sum of Ba and Ca is from 0.2 to 0.9; $M^{21}$ represents a group of tetravalent elements containing Si and Ge in a total amount of 90 mol % or more; $Z^1$ is at least one element selected from the group consisting of a minus monovalent and minus divalent elements, H and N; and a1 is a number satisfying $0.001 \leq a1 \leq 0.8$, b1 is a number satisfying $0 \leq b1 \leq 0.8$, c1 and d1 are numbers satisfying $0 \leq c1/(c1+d1) \leq 0.2$, a1, b1, c1 and d1 are numbers satisfying $1.8 \leq (a1+b1+c1+d1) \leq 2.2$, and e1 and f1 are numbers satisfying $0 \leq f1/(e1+f1) \leq 0.035$ and $3.6 \leq (e1+f1) \leq 4.4$.

$$Eu_{a2}Mn_{b2}Mg_{c2}M^{12}{}_{d2}M^{22}O_{e2}Z^2{}_{f2} \quad [3]$$

wherein $M^{12}$ represents at least one element selected from the group consisting of a monovalent element, a divalent element except Eu, Mn and Mg, a trivalent element and a pentavalent element, in which the proportion of the divalent element is 80 mol % or more, the proportion of the sum of Ba, Ca and Sr is 40 mol % or more, and the ratio (molar ratio) of Ca to the sum of Ba and Ca is less than 0.2; $M^{22}$ represents a group of tetravalent elements containing Si and Ge in a total amount of 90 mol % or more; $Z^2$ is at least one element selected from the group consisting of a minus monovalent and minus divalent elements, H and N; and a2 is a number satisfying $0.01 \leq a2 \leq 0.8$, b2 is a number satisfying $0 \leq b2 \leq 0.8$, c2 and d2 are numbers satisfying $0 \leq c2/(c2+d2) \leq 0.2$ or $0.3 \leq c2/(c2+d2) \leq 0.8$, a2, b2, c2 and d2 are numbers satisfying $1.8 \leq (a2+b2+c2+d2) \leq 2.2$, and e2 and f2 are numbers satisfying $0 \leq f2/(e2+f2) \leq 0.035$ and $3.6 \leq (e2+f2) \leq 4.4$.

According to the present invention, there is obtained a red or white phosphor having high luminance and from a bright tone to a deep tone, and there can be provided a light emitting device which efficiently emits visible light having high color rendering properties.

Figure 1:
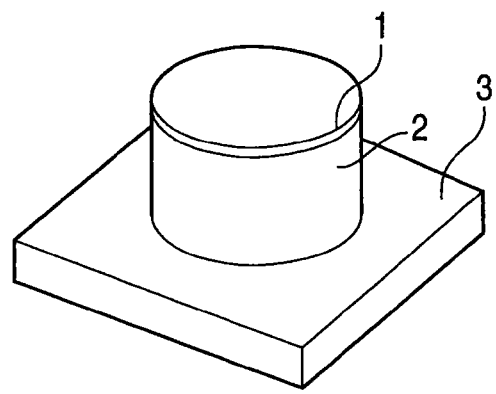
FIG. 1 is a view showing one example of a light emitting device in which a film-like phosphor is allowed to contact with or formed on a surface emitting type GaN-based diode.

As for reference numerals in the figures, 1 indicates a second light emitter, 2 indicates a surface emitting type GaN-based LD, 3 indicates a substrate, 4 indicates a light emitting device, 5 indicates a mount lead, 6 indicates an inner lead, 7 indicates a first light emitter (350 nm to 430 nm light emitter), 8 indicates a resin portion allowed to contain a phosphor of the present invention, 9 indicates a conductive wire, 10 indicates a mold member, 11 indicates a surface emitting lighting system in which light emitting elements are incorporated, 12 indicates a holding case, 13 indicates a light emitting device, and 14 indicates a diffuser panel, respectively.

BEST MODE FOR CARRYING OUT THE INVENTION

Embodiments of the present invention will be illustrated in detail below, but the present invention is not limited to the following embodiments, and can be carried out with various variations within the scope of its gist.

The present invention is a phosphor comprising a crystal phase having a chemical composition of the following formula [1], [2] or [3], and a light emitting device comprising the phosphor having a crystal phase having a chemical composition of the following formula [1], [2] or [3], and a light emitting source for irradiating it with light of 350 nm to 430 nm:

$$Eu_{a0}Mn_{b0}M^{10}{}_{c0}M^{20}{}_{d0}M^{30}O_{e0}Z^0{}_{f0} \quad [1]$$

$$Eu_{a1}Mn_{b1}Mg_{c1}M^{11}{}_{d1}M^{21}O_{e1}Z^1{}_{f1} \quad [2]$$

$$Eu_{a2}Mn_{b2}Mg_{c2}M^{12}{}_{d2}M^{22}O_{e2}Z^2{}_{f2} \quad [3]$$

First, formula [1] will be illustrated.

$M^{10}$ in formula [1] is a divalent element containing 85 mol % or more of at least one element selected from the group consisting of Ba, Ca and Sr, in which the ratio (molar ratio) of Ca to the sum of Ba and Ca is from 0.1 to 0.9. That is to say, almost all or all of it consists of at least one element selected from the group consisting of Ba, Ca and Sr. Another divalent element can be contained within the range that the performance is not impaired, and examples thereof include V, Cr, Fe, Co, Ni, Cu, Zn, Mo, Ru, Pd, Ag, Cd, Sn, Sm, Tm, Yb, W, Re, Os, Ir, Pt, Hg, Pb and the like. $M^{10}$ may contain at least one selected from the group of these elements at a ratio of 15 mol % or less in total. Of these, V, Zn, Mo, Sn, Sm, Tm, Yb, W, Pb and the like are difficult to have an influence on the performance, and can be contained in $M^{10}$ at a ratio of 15 mol % or less in total.

In $M^{10}$ in formula [1], the ratio (molar ratio) of Ca to the sum of Ba and Ca is from 0.1 to 0.9. However, in terms of emission intensity of a red color or a white color, and the like, the lower limit of the molar ratio of Ca to the sum of Ba and Ca is preferably 0.2 or more, and the upper limit is preferably 0.8 or less. The proportion of the sum of Ba and Ca in $M^{10}$ is preferably 70 mol % or more, more preferably 90 mol % or more, and still more preferably 100 mol %.

$M^{20}$ in formula [1] represents at least one element selected from the group consisting of a monovalent, trivalent and pentavalent elements, and examples thereof include but are not limited to Li, Na, K, Rb, Cs, B, Al, Ga, In, P, Sb, Bi, Ta, Nb, Rh, trivalent rear earth elements such as Y and Sc, and the like. In the sense of assisting crystallization of the silicate by diffusion of the divalent element in $M^{10}$ and activating elements $Eu^{2+}$ and $Mn^{2+}$ into a solid in burning, the monovalent, trivalent or pentavalent element can be introduced in small amounts as an element in $M^{10}$. The $M^{20}$ constituent element comprises an element which mainly substitutes an $M^{10}$ site, and $d0/(c0+d0)$, the ratio of the number of moles of $M^{20}$ to the total number of moles of $M^{10}$ and $M^{20}$, is $0 \leq d0/(c0+d0) \leq 0.2$. However, in terms of emission intensity of a red color or a white color, and the like, it is preferably $0 \leq d0/(c0+d0) \leq 0.1$, and more preferably $d0/(c0+d0)=0$.

$M^{30}$ in formula [1] represents a group of tetravalent elements containing Si and Ge in a total amount of 90 mol % or more. However, in terms of emission intensity of a red color or a white color, and the like, it is preferred that $M^{30}$ contains Si in an amount of 80 mol % or more, and it is more preferred that $M^{30}$ consists of Si. The tetravalent elements other than Si and Ge include Zn, Ti, Hf and the like. In terms of emission intensity of a red color or a white color, and the like, these may be contained within the range that the performance is not impaired.

$Z^0$ in formula [1] is at least one element selected from the group consisting of a minus monovalent and minus divalent elements, H and N. It may be, for example, F, Cl, Br, I or the like which is minus monovalent, as well as S, Se or Te which is the same minus divalent element as oxygen, and may contain an OH group. An oxygen group may be partially changed to an ON group or an N group. Further, $Z^0$ may be contained to such a degree that it has a little influence on fluorescent performance, that is to say, at a ratio of about 2 mol % or less based on the total elements in the impurity level. This corresponds to 0.035 or less as the molar ratio of $Z^0$ to ($Z^0$+oxygen atom). Accordingly, the range of $f0/(e0+f0)$ which is the molar ratio of $Z^0$ to ($Z^0$+oxygen atom) is $0 \leq f0/(e0+f0) \leq 0.035$. In terms of performance of the phosphor, it is preferably $f0/(e0+f0) \leq 0.01$, and preferably $f0/(e0+f0)=0$ in ordinary use.

As for the Eu molar ratio a0 in formula [1], a0 is a number satisfying $0.001 \leq a0 \leq 0.6$. When the molar ratio a0 of a luminescent center ion $Eu^{2+}$ is too small, the emission intensity tends to decrease. On the other hand, even when it is too large, the emission intensity also tends to decrease by a phenomenon called concentration quenching or temperature quenching. Accordingly, the lower limit is preferably $0.005 \leq a0$, and more preferably $0.02 \leq a0$, and the upper limit is more preferably $a0 \leq 0.5$.

The Mn molar ratio b0 in formula [1] is a factor which has a decisive influence on selection of red light emission or white light emission. When b0 is 0, no red peak is obtained to give only a blue or blue-green peak. However, when b0 takes a small positive number, a red peak appears in blue and green peaks to give white light emission as a whole. When b0 takes a larger positive number, blue and green peaks almost disappear to mainly give a red peak. The range of b0 is $0 < b0 \leq 0.7$ as a red phosphor or a white phosphor. It is conceivable that the phosphor receives irradiation of an excitation light source to excite $Eu^{+2}$, and that the energy of $Eu^{+2}$ excited thereby transfers to $Mn^{+2}$, which emits red light. The degree of energy transfer somewhat differs mainly according to the composition of $M^{10}$ and $M^{20}$, so that the boundary value of b0 at which the red phosphor is changed to the white phosphor somewhat differs according to the composition of $M^{10}$ and $M^{20}$. Accordingly, the good ranges of b0 for red light emission and white light emission can not be strictly distinguished. However, it is preferably $0 < b0 \leq 0.2$, and more preferably $0.02 \leq b0 \leq 0.2$, as the white phosphor, and it is preferably $0.05 \leq b0 \leq 0.7$, and more preferably $0.1 \leq b0 \leq 0.6$, as the red phosphor.

In the crystal phase $Eu_{a0}Mn_{b0}M^{10}{}_{c0}M^{20}{}_{d0}M^{30}{}_{c0}O_{e0}Z^0{}_{f0}$ in the above-mentioned formula [1], $Eu^{2+}$ and $Mn^{2+}$ are substituted by $M^{10}$ comprising a divalent element, $M^{30}$ is mainly occupied by Si, the anion is mainly oxygen, $M^{20}$ comprises a monovalent, trivalent or pentavalent element other than divalent and tetravalent elements which are main elements, and the total molar ratios of ($M^{10}+M^{20}$), $M^{30}$ and oxygen atoms are 2, 1 and 4, respectively, in its basic composition. Even when cation deficiency or anion deficiency somewhat occurs, it has no significant influence on the desired fluorescent performance. Accordingly, when the total molar ratio of $M^{30}$ mainly occupied by Si is fixed to 1 on the chemical formula, the molar ratio (a0+b0+c0+d0) of ($M^{10}+M^{20}$) is within the range of $1.8 \leq (a0+b0+c0+d0) \leq 2.2$, and preferably (a0+b0+c0+d0)=2 among others. Further, (e0+f0) which is the total molar ratio of a site on the anion side is usually within the range of $3.6 \leq (e0+f0) \leq 4.4$, and preferably e0=4 and f0=0 among others.

The phosphor used in the present invention can be produced by preparing a mixture of an $M^{10}$ source, an $M^{20}$ source and an $M^{30}$ source as shown in the above-mentioned formula [1] and element source compounds of Eu and Mn as activating elements by a mixing method of the following (A) or (B), and burning the mixture by heat treatment.

(A) A dry mixing method of combining pulverization using a dry pulverizer such as a hummer mill, a roll mill, a ball mill or a jetmill, or pulverization using a mortar and a pestle, and mixing using a mixer such as a ribbon blender, a V type blender or a Henschel mixer, or mixing using a mortar and a pestle.

(B) A wet mixing method of adding water or the like to form a slurry state or a solution state using a pulverizer or a mortar and a pestle, performing mixing by a pulverizer, a mortar and a pestle, an evaporating dish and a stirrer, or the like, and drying the mixture by spray drying, heat drying, air seasoning or the like.

Of these methods, particularly in the element source compounds for the activating elements, the use of a liquid medium is preferred because it is necessary to homogeneously mixing and dispersing small amounts of compounds over all. Further, also in that a mixture which is homogeneous over all is obtained for the other element source compounds, the latter wet method is preferred. Furthermore, the heat treatment method is conducted by performing heating in a heat-resistant container such as a crucible or tray using a material low in reactivity with the phosphor at a temperature of usually 750° C. to 1400° C., preferably 900° C. to 1300° C., under a single or mixed atmosphere of gases such as carbon monoxide, carbon dioxide, nitrogen, hydrogen and argon for 10 minutes to 24 hours. Washing, drying, classification treatment and the like are performed after the heat treatment as needed.

As the above-mentioned heating atmosphere, there is selected an atmosphere which is necessary for obtaining an ion state (valence) in which the activating element contributes to light emission. In the case of divalent Eu and Mn and the like in the present invention, heating under a neutral or reducing atmosphere of carbon monoxide, nitrogen, hydrogen, argon or the like is preferred, and heating under a reducing atmosphere containing carbon monoxide or hydrogen is more preferred. The existence of carbon in the atmosphere is still more preferred. Specifically, it is achieved by heating with a carbon heater furnace, heating using a container such as a crucible made of carbon, under a reducing atmosphere, heating with the coexistence of carbon beads or the like in a reducing atmosphere, and the like.

The $M^{10}$ sources, the $M^{20}$ sources, the $M^{30}$ sources and the element source compounds of the activating elements include an oxide, a hydroxide, a carbonate, a nitrate, a sulfate, an oxalate, a carboxylate, a halide and the like of $M^{10}$, $M^{20}$, $M^{30}$ and the activating element, respectively, and are selected from these, considering reactivity with a complex oxide, non-occurrence of $NO_x$, $SO_x$ and the like, and the like.

Specifically exemplifying the $M^{10}$ source compounds for the above-mentioned Ba, Ca and Sr cited as $M^{10}$, the Ba source compounds include BaO, $Ba(OH)_2.8H_2O$, $BaCO_3$, $Ba(NO_3)_2$, $BaSO_4$, $Ba(OCO)_2.2H_2O$, $Ba(OCOCH_3)_2$, $BaCl_2$ and the like, the Ca source compounds include CaO, $Ca(OH)_2$, $CaCO_3$, $Ca(NO_3)_2.4H_2O$, $CaSO_4.2H_2O$, $Ca(OCO)_2.H_2O$, $Ca(OCOCH_3)_2.H_2O$, $CaCl_2$ and the like, and the Sr source compounds include SrO, $Sr(OH)_2.8H_2O$, $SrCO_3$, $Sr(NO_3)_2$, $SrSO_4$, $Sr(OCO)_2.H_2O$, $Sr(OCOCH_3)_2.0.5H_2O$, $SrCl_2$ and the like.

Specifically exemplifying the $M^{30}$ source compounds for the above-mentioned Si and Ge cited as $M^{30}$, the Si source compounds include $SiO_2$, $H_4SiO_4$, $Si(OCOCH_3)_4$ and the like, and the Ge source compounds include $GeO_2$, $Ge(OH)_4$, $Ge(OCOCH_3)_4$, $GeCl_4$ and the like.

Further, specifically exemplifying the element source compounds for the above-mentioned Eu and Mn cited as the activating elements, they include $Eu_2O_3$, $Eu_2(SO_4)_3$, $Eu_2(OCO)_6$, $EuCl_2$, $EuCl_3$, $Eu(NO_3)_3.6H_2O$, $Mn(NO_3)_2.6H_2O$, $MnO_2$, $Mn_2O_3$, $Mn_3O_4$, MnO, $Mn(OH)_2$, $MnCO_3$, $Mn(OCOCH_3)_2.2H_2O$, $Mn(OCOCH_3)_3.nH_2O$, $MnCl_2.4H_2O$ and the like.

Then, the following formula [2] will be illustrated.

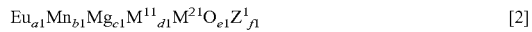

$$Eu_{a1}Mn_{b1}Mg_{c1}M^{11}{}_{d1}M^{21}{}_{e1}O_{e1}Z^{1}{}_{f1} \qquad [2]$$

$M^{11}$ in formula [2] represents at least one element selected from the group consisting of a monovalent element, a divalent element except Eu, Mn and Mg, a trivalent element and a pentavalent element, and satisfies conditions that the proportion of the divalent element is 80 mol % or more, that the proportion of the sum of Ba, Ca and Sr is 40 mol % or more, and that the ratio (molar ratio) of Ca to the sum of Ba and Ca is from 0.2 to 0.9. Specifically describing the elements other than Ba, Ca and Sr, the monovalent elements include Li, Na, K, Rb, Cs and the like, the divalent elements include V, Cr, Fe, Co, Ni, Cu, Zn, Mo, Ru, Pd, Ag, Cd, Sn, Sm, Tm, Yb, W, Re, Os, Ir, Pt, Hg, Pb and the like, the trivalent elements include B, Al, Ga, In and the like, and a rare earth element such as Y or Sc, and the pentavalent elements include P, Sb and Bi. However, they are not limited thereto. Above all, in the divalent elements, V, Zn, Mo, Sn, Sm, Tm, Yb, W and Pb are difficult to have an influence on the performance.

In the sense of assisting crystallization of the silicate by diffusion of the divalent element in $M^{11}$ and activating elements $Eu^{2+}$ and $Mn^{2+}$ into a solid in burning, the monovalent, trivalent or pentavalent element may be introduced in a total amount of 20 mol % or less. In terms of emission intensity of a red color or a white color, and the like, the ratio (molar ratio) of Ca to the sum of Ba and Ca is preferably from 0.2 to 0.8. In terms of emission intensity of a red color or a white color, and the like, the proportion of the sum of Ba, Ca and Sr is preferably 80 mol % or more, more preferably the proportion of the sum of Ba and Ca is 80 mol % or more, and still more preferably the proportion of the sum of Ba, Ca and Sr is 100 mol %.

$M^{21}$ in formula [2] represents a group of tetravalent elements containing Si and Ge in a total amount of 90 mol % or more. However, in terms of emission intensity of a red color or a white color, and the like, it is preferred that $M^{21}$ contains Si in an amount of 80 mol % or more, and it is more preferred that $M^{21}$ consists of Si. The tetravalent elements other than Si and Ge include Zn, Ti, Hf and the like. In terms of emission intensity of a red color or a white color, and the like, these may be contained within the range that the performance is not impaired.

$Z^1$ in formula [2] is at least one element selected from the group consisting of a minus monovalent and minus divalent elements, H and N. It may be, for example, F, Cl, Br, I or the like which is minus monovalent, as well as S, Se or Te which is the same minus divalent element as oxygen, and may contain an OH group. An oxygen group may be partially changed to an ON group or an N group. Further, $Z^1$ may be contained to such a degree that it has a little influence on fluorescent performance, that is to say, at a ratio of about 2 mol % or less based on the total elements in the impurity level. This corresponds to 0.035 or less as the molar ratio of $Z^1$ to ($Z^1$+oxygen atom). Accordingly, the range of f1/(e1+f1) which is the molar ratio of $Z^1$ to ($Z^1$+oxygen atom) is $0 \leq f1/(e1+f1) \leq 0.035$. In terms of performance of the phosphor, it is preferably $f1/(e1+f1) \leq 0.01$, and preferably $f1/(e1+f1)=0$.

As for the Eu molar ratio a1 in formula [2], a1 is a number satisfying $0.001 \leq a1 \leq 0.8$. When the molar ratio a1 of a luminescent center ion $Eu^{2+}$ is too small, the emission intensity tends to decrease. On the other hand, even when it is too large, the emission intensity also tends to decrease by a phenomenon called concentration quenching or temperature quenching. Accordingly, the lower limit is preferably $0.005 \leq a1$, and more preferably $0.02 \leq a1$, and the upper limit is more preferably $a1 \leq 0.5$.

The Mn molar ratio b1 in formula [2] is a factor which has a decisive influence on selection of red light emission or white light emission. When b1 is 0, no red peak is obtained to give only a blue or blue-green peak. However, when b1 takes a small positive number, a red peak appears in blue and green peaks to give white light emission as a whole. When b1 takes a larger positive number, blue and green peaks almost disappear to mainly give a red peak. The range of b1 is $0<b1 \leq 0.8$ as a red phosphor or a white phosphor. It is conceivable that the phosphor receives irradiation of an excitation light source to excite $Eu^{+2}$, and that the energy of $Eu^{+2}$ excited thereby transfers to $Mn^{+2}$, which emits red light. The degree of energy transfer somewhat differs mainly according to the composition of $M^{11}$ and $M^{21}$, so that the boundary value of b1 at which the red phosphor is changed to the white phosphor somewhat differs according to the composition of $M^{11}$ and $M^{21}$. Accordingly, the good ranges of b1 for red light emission and white light emission can not be strictly distinguished. However, it is preferably $0<b1 \leq 0.15$, and more preferably $0.01 \leq b1 \leq 0.15$, as the white phosphor, and it is preferably $0.03 \leq b1 \leq 0.8$, and more preferably $0.06 \leq b1 \leq 0.4$, as the red phosphor.

Mg in formula [2] is substituted by $M^{11}$ mainly comprising a divalent element, and c1/(c1+d1), the ratio of the number of moles of Mg to the total number of moles of Mg and $M^{11}$, is $0<c1/(c1+d1) \leq 0.2$. However, in terms of emission intensity of a red color or a white color, and the like, it is preferably $0<c1/(c1+d1) \leq 0.7$.

In the crystal phase $Eu_{a1}Mn_{b1}Mg_{c1}M^{11}{}_{d1}M^{21}{}_{e1}O_{e1}Z^{1}{}_{f1}$ in the above-mentioned formula [2], $Eu^{2+}$, $Mn^{2+}$ and $Mg^{+2}$ are substituted by $M^{11}$ mainly comprising a divalent element, $M^{21}$ is mainly occupied by Si and Ge, the anion is mainly oxygen, and the total molar ratios of $M^{11}$, $M^{21}$ and oxygen atoms are 2, 1 and 4, respectively, in its basic composition. Even when cation deficiency or anion deficiency somewhat occurs, it has no significant influence on the desired fluorescent performance. Accordingly, when the total molar ratio of $M^{21}$ mainly occupied by Si and Ge is fixed to 1 on the chemical formula, the molar ratio (a1+b1+c1+d1) of ($M^{11}$+Eu+Mn+Mg) is within the range of $1.8 \leq (a1+b1+c1+d1) \leq 2.2$, preferably from 1.9 to 2.1, and more preferably (a1+b1+c1+d1)=2. Further, (e1+f1) which is the total molar ratio of a site on the anion side is within the range of $3.6 \leq (e1+f1) \leq 4.4$, preferably from 3.8 to 4.2, and more preferably e1=4 and f1=0.

The phosphor used in the present invention can be produced by preparing a mixture of an $M^{11}$ source, an $M^{21}$ source and a Mg source as shown in the above-mentioned formula [2] and element source compounds of Eu and Mn as activating elements by a mixing method of the following (A) or (B), and burning the mixture by heat treatment.

(A) A dry mixing method of combining pulverization using a dry pulverizer such as a hummer mill, a roll mill, a ball mill or a jet mill, or pulverization using a mortar and a pestle, and mixing using a mixer such as a ribbon blender, a V type blender or a Henschel mixer, or mixing using a mortar and a pestle.

(B) A wet mixing method of adding water or the like to form a slurry state or a solution state using a pulverizer or a mortar and a pestle, performing mixing by a pulverizer, a mortar and a pestle, an evaporating dish and a stirrer, or the like, and drying the mixture by spray drying, heat drying, air seasoning or the like.

Of these mixing methods, particularly in the element source compounds for the activating elements, the use of a liquid medium is preferred because it is necessary to homogeneously mixing and dispersing small amounts of compounds over all. Further, also in that a mixture which is homogeneous over all is obtained for the other element source compounds, the latter wet method is preferred. Furthermore, the heat treatment method is conducted by performing heating in a heat-resistant container such as a crucible or tray using a material low in reactivity with the phosphor at a temperature of usually 750° C. to 1400° C., preferably 900° C. to 1300° C., under a single or mixed atmosphere of gases such as carbon monoxide, carbon dioxide, nitrogen, hydrogen and argon for 10 minutes to 24 hours. Washing, drying, classification treatment and the like are performed after the heat treatment as needed.

As the above-mentioned heating atmosphere, there is selected an atmosphere which is necessary for obtaining an ion state (valence) in which the activating element contributes to light emission. In the case of divalent Eu and Mn and the like in the present invention, heating under a neutral or reducing atmosphere of carbon monoxide, nitrogen, hydrogen, argon or the like is preferred, and heating under a reducing atmosphere containing carbon monoxide or hydrogen is more preferred. The existence of carbon in the atmosphere is still more preferred. Specifically, it is achieved by heating with a carbon heater furnace, heating using a container such as a crucible made of carbon, under a reducing atmosphere, heating with the coexistence of carbon beads or the like in a reducing atmosphere, and the like.

The $M^{11}$ sources, the $M^{21}$ sources, the Mg sources and the element source compounds of the activating elements include an oxide, a hydroxide, a carbonate, a nitrate, a sulfate, an oxalate, a carboxylate, a halide and the like of $M^{11}$, $M^{21}$, Mg and the activating element, respectively, and are selected from these, considering reactivity with a complex oxide, nqn-occurrence of $NO_x$, $SO_x$ and the like, and the like.

Specifically exemplifying the $M^{11}$ source compounds for the above-mentioned Ba, Ca and Sr cited as $M^{11}$, the Ba source compounds include $BaO$, $Ba(OH)_2 \cdot 8H_2O$, $BaCO_3$, $Ba(NO_3)_2$, $BaSO_4$, $Ba(OCO)_2 \cdot 2H_2O$, $Ba(OCOCH_3)_2$, $BaCl_2$ and the like, the Ca source compounds include $CaO$, $Ca(OH)_2$, $CaCO_3$, $Ca(NO_3)_2 \cdot 4H_2O$, $CaSO_4 \cdot 2H_2O$, $Ca(OCO)_2 \cdot H_2O$, $Ca(OCOCH_3)_2 \cdot H_2O$, $CaCl_2$ and the like, and the Sr source compounds include $SrO$, $Sr(OH)_2 \cdot 8H_2O$, $SrCO_3$, $Sr(NO_3)_2$, $SrSO_4$, $Sr(OCO)_2 \cdot H_2O$, $Sr(OCOCH_3)_2 \cdot 0.5H_2O$, $SrCl_2$ and the like.

Specifically exemplifying the $M^{21}$ source compounds for the above-mentioned Si and Ge cited as $M^{21}$, the Si source compounds include $SiO_2$, $H_4SiO_4$, $Si(OCOCH_3)_4$ and the like, and the Ge source compounds include $GeO_2$, $Ge(OH)_4$, $Ge(OCOCH_3)_4$, $GeCl_4$ and the like.

Specifically exemplifying the Mg source compounds for Mg, they include $MgO$, $Mg(OH)_2$, $MgCO_3$, $Mg(OH)_2 \cdot 3MgCO_3 \cdot 3H_2O$, $Mg(NO_3)_2 \cdot 6H_2O$, $MgSO_4$, $Mg(OCO)_2 \cdot 2H_2O$, $Mg(OCOCH_3)_2 \cdot 4H_2O$, $MgCl_2$ and the like.

Further, specifically exemplifying the element source compounds for the above-mentioned Eu and Mn cited as the activating elements, they include $Eu_2O_3$, $Eu_2(SO_4)_3$, $Eu_2(OCO)_6$, $EuCl_2$, $EuCl_3$, $Eu(NO_3)_3 \cdot 6H_2O$, $Mn(NO_3)_2 \cdot 6H_2O$, $MnO_2$, $Mn_2O_3$, $Mn_3O_4$, $MnO$, $Mn(OH)_2$, $MnCO_3$, $Mn(OCOCH_3)_2 \cdot 2H_2O$, $Mn(OCOCH_3)_3 \cdot nH_2O$, $MnCl_2 \cdot 4H_2O$ and the like.

Then, the following formula [3] will be illustrated.

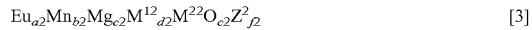

$$Eu_{a2}Mn_{b2}Mg_{c2}M^{12}{}_{d2}M^{22}O_{e2}Z^2{}_{f2} \quad [3]$$

$M^{12}$ in formula [3] represents at least one element selected from the group consisting of a monovalent element, a divalent element except Eu, Mn and Mg, a trivalent element and a pentavalent element, and satisfies conditions that the proportion of the divalent element is 80 mol % or more, that the proportion of the sum of Ba, Ca and Sr is 40 mol % or more, and that the ratio (molar ratio) of Ca to the sum of Ba and Ca is less than 0.2.

Specifically describing the elements other than Ba, Ca and Sr, the monovalent elements include Li, Na, K, Rb, Cs and the like, the divalent elements include V, Cr, Fe, Co, Ni, Cu, Zn, Mo, Ru, Pd, Ag, Cd, Sn, Sm, Tm, Yb, W, Re, Os, Ir, Pt, Hg, Pb and the like, the trivalent elements include B, Al, Ga, In and the like, and a rare earth element such as Y or Sc, and the pentavalent elements include P, Sb, Bi and the like. However, they are not limited thereto. Above all, in the divalent elements, V, Zn, Mo, Sn, Sm, Tm, Yb, W and Pb are difficult to have an influence on the performance.

In the sense of assisting crystallization of the silicate by diffusion of the divalent element in $M^{12}$ and activating elements $Eu^{2+}$ and $Mn^{2+}$ into a solid in burning, the monovalent, trivalent or pentavalent element may be introduced in a total amount of 20 mol % or less.

In terms of a deep red component and the like, the ratio (molar ratio) of Ca to the sum of Ba and Ca is preferably less than 0.1, and more preferably 0. In terms of emission intensity of a red color or a white color, and the like, the proportion of the sum of Ba, Ca and Sr is preferably 80 mol % or more, more preferably the proportion of the sum of Ba and Ca is 80 mol % or more, and still more preferably the proportion of the sum of Ba, Ca and Sr is 100 mol %.

$M^{22}$ in formula [3] represents a group of tetravalent elements containing Si and Ge in a total amount of 90 mol % or more. However, in terms of emission intensity of a red color or a white color, and the like, it is preferred that $M^{22}$ contains Si in an amount of 80 mol % or more, and it is more preferred that $M^{22}$ consists of Si. The tetravalent elements other than Si and Ge include Zn, Ti, Hf and the like. In terms of emission intensity of a red color or a white color, and the like, these may be contained within the range that the performance is not impaired.

$Z^2$ in formula [3] is at least one element selected from the group consisting of a minus monovalent and minus divalent elements, H and N. It may be, for example, F, Cl, Br, I or the like which is minus monovalent, as well as S, Se or Te which is the same minus divalent element as oxygen, and may contain an OH group. An oxygen group may be partially changed to an ON group or an N group. Further, $Z^2$ may be contained to such a degree that it has a little influence on fluorescent performance, that is to say, at a ratio of about 2 mol % or less based on the total elements in the impurity level. This corresponds to 0.035 or less as the molar ratio of $Z^2$ to ($Z^2$+oxygen atom). Accordingly, the range of f2/(e2+f2) which is the molar ratio of $Z^2$ to ($Z^2$+oxygen atom) is $0 \leq f2/(e2+f2) \leq 0.035$. In terms of performance of the phosphor, it is preferably $f2/(e2+f2) \leq 0.01$, and preferably $f2/(e2+f2)=0$.

As for the Eu molar ratio a2 in formula [3], a2 is a number satisfying $0.01 < a2 \leq 0.8$. When the molar ratio a2 of a luminescent center ion $Eu^{2+}$, is too small, the emission intensity tends to decrease, preferably 0.001 or more, more preferably 0.01 or more. On the other hand, even when it is too large, the emission intensity also tends to decrease by a phenomenon called concentration quenching or temperature quenching. The upper limit is more preferably $a2 \leq 0.5$.

The Mn molar ratio b2 in formula [3] is a factor which has a decisive influence on selection of red light emission or white light emission. When b2 is 0, no red peak is obtained to give only a blue or blue-green peak. However, when b2 takes a small positive number, a red peak appears in blue and green peaks to give white light emission as a whole. When b2 takes a larger positive number, blue and green peaks almost disappear to mainly give a red peak. The range of b2 is $0 < b2 \leq 0.8$ as a red phosphor or a white phosphor. It is conceivable that the phosphor receives irradiation of an excitation light source to excite $Eu^{+2}$, and that the energy of $Eu^{+2}$ excited thereby transfers to $Mn^{+2}$, which emits red light. The degree of energy transfer somewhat differs mainly according to the composition of $M^{12}$ and $M^{22}$, so that the boundary value of b2 at which the red phosphor is changed to the white phosphor somewhat differs according to the composition of $M^{12}$ and $M^{22}$. Accordingly, the good ranges of b2 for red light emission and white light emission can not be strictly distinguished. However, in terms of intensity of a luminescent color including the red color and the white color, and the like, it is more preferably $0.002 \leq b2 \leq 0.6$, and still more preferably $0.005 \leq b2 \leq 0.4$. In the present invention, the term "white color" should be broadly interpreted, and means that two or more maximum values exist in an emission spectrum, and each is a broad band emission peak.

Mg in formula [3] is substituted by $M^{12}$ mainly comprising a divalent element, and c2/(c2+d2), the ratio of the number of moles of Mg to the total number of moles of Mg and $M^{12}$, is $0 < c2/(c2+d2) \leq 0.2$ or $0.3 \leq c2/(c2+d2) \leq 0.8$. However, in terms of emission intensity of a red color or a white color, and the like, it is preferably $0 < c2/(c2+d2) \leq 0.7$.

In the crystal phase $Eu_{a2}Mn_{b2}Mg_{c2}M^{12}{}_{d2}M^{22}{}_{e2}O_{e2}Z^2{}_{f2}$ in the above-mentioned formula [3], $Eu^{2+}$, $Mn^{2+}$ and $Mg^{+2}$ are substituted by $M^{12}$ mainly comprising a divalent element, $M^{22}$ is mainly occupied by Si and Ge, the anion is mainly oxygen, and the total molar ratios of $M^{12}$, $M^{22}$ and oxygen atoms are 2, 1 and 4, respectively, in its basic composition. Even when cation deficiency or anion deficiency somewhat occurs, it has no significant influence on the desired fluorescent performance. Accordingly, when the total molar ratio of $M^{22}$ mainly occupied by Si and Ge is fixed to 1 on the chemical formula, the molar ratio (a2+b2+c2+d2) of ($M^{12}$+Eu+Mn+Mg) is within the range of $1.8 \leq (a2+b2+c2+d2) \leq 2.2$, preferably from 1.9 to 2.1, and more preferably (a2+b2+c2+d2)=2. Further, (e2+f2) which is the total molar ratio of a site on the anion side is within the range of $3.6 \leq (e2+f2) \leq 4.4$, and more preferably e2=4 and f2=0.

The phosphor used in the present invention can be produced by preparing a mixture of an $M^{12}$ source, an $M^{22}$ source and a Mg source as shown in the above-mentioned formula [3] and element source compounds of Eu and Mn as activating elements by a mixing method of the following (A) or (B), and burning the mixture by heat treatment.

(A) A dry mixing method of combining pulverization using a dry pulverizer such as a hummer mill, a roll mill, a ball mill or a jet mill, or pulverization using a mortar and a pestle, and mixing using a mixer such as a ribbon blender, a V type blender or a Henschel mixer, or mixing using a mortar and a pestle.

(B) A wet mixing method of adding water or the like to form a slurry state or a solution state using a pulverizer or a mortar and a pestle, performing mixing by a pulverizer, a mortar and a pestle, an evaporating dish and a stirrer, or the like, and drying the mixture by spray drying, heat drying, air seasoning or the like.

Of these methods, particularly in the element source compounds for the activating elements, the use of a liquid medium is preferred because it is necessary to homogeneously mixing and dispersing small amounts of compounds over all. Further, also in that a mixture which is homogeneous over all is obtained for the other element source compounds, the latter wet method is preferred. Furthermore, the heat treatment method is conducted by performing heating in a heat-resistant container such as a crucible or tray using a material low in reactivity with the phosphor at a temperature of usually 750° C. to 1400° C., preferably 900° C. to 1300° C., under a single or mixed atmosphere of gases such as carbon monoxide, carbon dioxide, nitrogen, hydrogen and argon for 10 minutes to 24 hours. Washing, drying, classification treatment and the like are performed after the heat treatment as needed.

As the above-mentioned heating atmosphere, there is selected an atmosphere which is necessary for obtaining an ion state (valence) in which the activating element contributes to light emission. In the case of divalent Eu and Mn and the like in the present invention, heating under a neutral or reducing atmosphere of carbon monoxide, nitrogen, hydrogen, argon or the like is preferred, and heating under a reducing atmosphere containing carbon monoxide or hydrogen is more preferred. The existence of carbon in the atmosphere is still more preferred. Specifically, it is achieved by heating with a carbon heater furnace, heating using a container such as a crucible made of carbon, under a reducing atmosphere, heating with the coexistence of carbon beads or the like in a reducing atmosphere, and the like.

The $M^{12}$ sources, the $M^{22}$ sources, the Mg sources and the element source compounds of the activating elements include an oxide, a hydroxide, a carbonate, a nitrate, a sulfate, an oxalate, a carboxylate, a halide and the like of $M^{12}$, $M^{22}$, Mg and the activating element, respectively, and are selected from these, considering reactivity with a complex oxide, non-occurrence of $NO_x$, $SO_x$ and the like, and the like.

Specifically exemplifying the $M^{12}$ source compounds for the above-mentioned Ba, Ca and Sr cited as $M^{12}$, the Ba source compounds include BaO, $Ba(OH)_2 \cdot 8H_2O$, $BaCO_3$, $Ba(NO_3)_2$, $BaSO_4$, $Ba(OCO)_2 \cdot 2H_2O$, $Ba(OCOCH_3)_2$, $BaCl_2$ and the like, the Ca source compounds include CaO, $Ca(OH)_2$, $CaCO_3$, $Ca(NO_3)_2 \cdot 4H_2O$, $CaSO_4 \cdot 2H_2O$, $Ca(OCO)_2 \cdot H_2O$, $Ca(OCOCH_3)_2 \cdot H_2O$, $CaCl_2$ and the like, and the Sr source compounds include SrO, Sr(OH)$_2$.8H$_2$O, SrCO$_3$, Sr(NO$_3$)$_2$, SrSO$_4$, Sr(OCO)2.H$_2$O, Sr(OCOCH$_3$)$_2$.0.5H$_2$O, SrCl$_2$ and the like.

Specifically exemplifying the M$^{22}$ source compounds for the above-mentioned Si and Ge cited as M$^{22}$, the Si source compounds include SiO$_2$, H$_4$SiO$_4$, Si(OCOCH$_3$)$_4$ and the like, and the Ge source compounds include GeO$_2$, Ge(OH)$_4$, Ge(OCOCH$_3$)$_4$, GeCl$_4$ and the like.

Specifically exemplifying the Mg source compounds for Mg, they include MgO, Mg(OH)$_2$, MgCO$_3$, Mg(OH)$_2$.3MgCO$_3$.3H$_2$O, Mg(NO$_3$)$_2$.6H$_2$O, MgSO$_4$, Mg(OCO)$_2$.2H$_2$O, Mg (OCOCH$_3$)$_2$.4H$_2$O, MgCl$_2$ and the like.

Further, specifically exemplifying the element source compounds for the above-mentioned Eu and Mn cited as the activating elements, they include Eu$_2$O$_3$, Eu$_2$(SO$_4$)$_3$, Eu$_2$(OCO)$_6$, EuCl$_2$, EuCl$_3$, Eu(NO$_3$)$_3$.6H$_2$O, Mn(NO$_3$)$_2$.6H$_2$O, MnO$_2$, Mn$_2$O$_3$, Mn$_3$O$_4$, MnO, Mn(OH)$_2$, MnCO$_3$, Mn(OCOCH$_3$)$_2$.2H$_2$O, Mn(OCOCH$_3$)$_3$.nH$_2$O, MnCl$_2$.4H$_2$O and the like.

The inventors of this application have found that the phosphor having the specified crystal structure, in addition to the above-mentioned composition range, shows particularly high emission intensity, thus completing the present invention. The definition of the crystal structure is generally made using a crystal system, a space group or the like. However, in the crystal phase in the present invention, a change in the crystal system or the space group occurs by distortion of the crystal structure (delicate structural change) associated with a change in composition, so that a univocal structural definition can not be carried out. Then, an X-ray diffraction pattern necessary for specifying the crystal phase which contributes to light emission is disclosed. Usually, in order to specify the identity of crystal structures of two compounds by the X-ray diffraction pattern, the agreement in angles (2θ) of about 6 diffraction peaks including a highest diffraction peak based on its crystal structure is sufficient. However, when the constituent element ratios are different as the compounds of the present invention, the angles of the diffraction peaks shift even though the crystal structures are the same. Accordingly, the specific angles of the diffraction peaks can not be defined as numerical values. Then, the present inventors have given attention to a plane spacing of the diffraction peak calculated using the Bragg equation, and have specified the angle range of the diffraction peak by the following indication method.

Bragg Equation $$d=\lambda/\{2\times\sin(\theta)\} \quad \text{(equation 1)}$$

$$\theta=\arcsin\{\lambda/(2\times d)\} \quad \text{(equation 2)}$$

d: Plane spacing (angstrom)
θ: Bragg angle (°)
λ: X-ray wavelength of CuKα=1.54184 angstroms In addition, (Equation 2) is one into which (equation 1) is changed. When the plane spacing range of a reference diffraction peak is defined as 4.17 angstroms to 3.95 angstroms, the range of the diffraction angle (2θ) becomes 21.3° to 22.5° from (equation 2).

From the angle (θ0) of the reference diffraction peak measured, the plane spacing (d0) of the reference diffraction peak becomes the following (equation 3) according to (equation 1).

$$d0=\lambda/\{2\times\sin(\theta0)\} \quad \text{(equation 3)}$$

Five peaks other than the reference diffraction peak are taken as P1, P2, P3, P4 and P5 from the low angle side, and the angle ranges in which the respective peaks appear are in turn taken as R1, R2, R3, R4 and R5.

The angle range R1 in which P1 appears is determined as follows. When a diffraction plane has a plane spacing of 0.720 time the plane spacing (d0) derived from the reference diffraction peak, and the deviation of the plane spacing associated with strain of the structure is taken as 1.5%, the start angle (R1s) and end angle (R1e) of the angle range R1 are derived from (equation 1) as follows:

R1s: 2×arcsin {λ/(2×d0×0.720×1.015)}

R1e: 2×arcsin {λ/(2×d0×0.720×0.985)}

Substitution of (equation 3) in each results in the following:

R1s: 2×arcsin { sin(θ0)/(0.720×1.015)}

R1e: 2×arcsin { sin(θ0)/(0.720×0.985)}

When hereinafter in the same way, the angle ranges in which P2, P3, P4 and P5 appear are defined as 0.698 time, 0.592 time, 0.572 time and 0.500 time, respectively, the plane spacing derived from the reference diffraction peak, and the deviation of the plane spacing associated with strain of the structure is taken as 1.5% without variation, the respective angle ranges become as follows:

R2s: 2×arcsin { sin(θ0)/(0.698×1.015)}

R2e: 2×arcsin { sin(θ0)/(0.698×0.985)}

R3s: 2×arcsin { sin(θ0)/(0.592×1.015)}

R3e: 2×arcsin { sin(θ0)/(0.592×0.985)}

R4s: 2×arcsin { sin(θ0)/(0.572×1.015)}

R4e: 2×arcsin { sin(θ0)/(0.572×0.985)}

R5s: 2×arcsin { sin(θ0)/(0.500×1.015)}

R5e: 2×arcsin { sin(θ0)/(0.500×0.985)}

That is to say, for the results of X-ray diffraction measurement thus obtained, the presence of the specified crystal structure as defined in the present invention can be confirmed by confirming that the respective peaks from the reference peak PO to P5 appear in the above-mentioned angle ranges. For example, in X-ray diffraction measurement using a CuKα as an X-ray source, a diffraction peak is observed within the range (R0) of the diffraction angle (2θ) of from 21.30° to 22.50°, and when this diffraction peak is taken as a reference diffraction peak (P0) and 5 diffraction angle ranges derived from the Bragg angle (θs) of P0 are taken as R1, R2, R3, R4 and R5, at least one diffraction peak exists in these 5 ranges, with the proviso that P0 has an intensity of 20% or more by the diffraction peak height ratio, based on the strongest diffraction peak of said 6 or more crystal phase-derived diffraction peaks, and the other peaks has an intensity of 9% or more by the diffraction peak height ratio, wherein when two or more diffraction peaks exist in one angle range, a peak higher in intensity is selected.

This crystal phase is a crystal phase different from merwinite described in non-patent document 1 and non-patent document 2. The above-mentioned angle ranges R1 to R5 are more preferably as follows in which the deviation of the plane spacing associated with strain of the structure is taken as 1.0% without variation.

R1: 2×arcsin {sin(θ0)/(0.720×1.010)}to 2×arcsin {sin (θ0)/(0.720×0.990)}

R2: 2×arcsin {sin(θ0)/(0.698×1.010)}to 2×arcsin {sin (θ0)/(0.698×0.990)}

R3: 2×arcsin {sin(θ0)/(0.592×1.010)} to 2×arcsin {sin(θ0)/(0.592×0.990)}

R4: 2×arcsin {sin(θ0)/(0.572×1.010)} to 2×arcsin {sin(θ0)/(0.572×0.990)}

R5: 2×arcsin {sin(θ0)/(0.500×1.010)} to 2×arcsin {sin(θ0)/(0.500×0.990)}

Although a method for preparing the above-mentioned crystal phase which characterizes the present invention is not limited, the desired crystal phase can be obtained by using, for example, a raw material having a small particle size of 10 μm or less, particularly a raw material in which silica contains no water, allowing local aggregates not to exist before burning, which are considered to be uneven in composition, and performing burning under a reducing atmosphere using a crucible made of carbon.

As described above, it has become clear that all the phosphors having high emission intensity which are obtained in the present invention contain the above-mentioned specified crystal phase. From this, it is true that they are a phosphor comprising a crystal phase of an alkaline earth silicate containing at least one element selected from the group consisting of Ba, Sr, Ca and Mg, and a phosphor characterized by containing the above-mentioned specified crystal phase.

In the present invention, a first light emitter which irradiates the above-mentioned phosphor with light emits light having a wavelength of 350 nm to 430 nm. Preferably, there is used a light emitter which emits light having the peak wavelength in the wavelength range of 350 nm to 430 nm. Specific examples of the first light emitters include a light emitting diode (LED), a laser diode (LD) and the like. In terms of low electric power consumption, a laser diode is more preferred. Above all, preferred is a GaN-based LED or LD using a GaN-based compound semiconductor. This is because the GaN-based LED or LD is markedly high in emission output and external quantum efficiency, compared to a SiC-based LED or the like which emits light in this region, and extremely bright light emission is obtained at extremely low electric power by combination with the above-mentioned phosphor. For example, the GaN-based LED or LD usually has an emission intensity of 100 times or more that of the SiC-based, for a current load of 20 mA. In the GaN-based LED or LD, one having an $Al_xGa_yN$ light emitting layer, a GaN light emitting layer or an $In_xGa_yN$ light emitting layer is preferred. In the GaN-based LED, of these, one having the $In_xGa_yN$ light emitting layer is particularly preferred because of its extremely high emission intensity. In the GaN-based LD, one having a multiple quantum well structure of the $In_xGa_yN$ layer and the GaN layer is particularly preferred because of its extremely high emission intensity. In the above, the value of X+Y is usually a value ranging from 0.8 to 1.2. In the GaN-based LED, one in which the light emitting layer is doped with Zn or Si or dopant-free one is preferred in terms of controlling emission characteristics. The GaN-based LED has the light emitting layer, a p layer, an n layer, electrodes and a substrate as basic constituent elements. One having a hetero structure in which the light emitting layer is sandwiched between the n type and p type $Al_xGa_yN$ layers, GaN layers, $In_xGa_yN$ layers or the like is preferred because of its high emission efficiency, and further, one in which the hetero structure is formed into a quantum well structure is more preferred because of its higher emission efficiency.

In the present invention, it is particularly preferred to use a surface emitting type light emitter, particularly a surface emitting type GaN-based laser diode, as the first light emitter, because it results in enhancement of emission efficiency of the whole light emitting device. The surface emitting type light emitter is a light emitter having strong light emission in the surface direction of a film. In the surface emitting type GaN-based laser diode, light emission in the surface direction of the light emitting layer can be made stronger than that in the edge direction by controlling the growth of crystals of the light emitting layer and the like and devising well a reflective layer and the like. The emission cross sectional area per unit emission amount can be increased by using the surface emitting type one, compared to the type of emitting light from the edges of the light emitting layer. As a result, when the phosphor of the second light emitter is irradiated with the light, the irradiation area can be extremely increased at the same amount of light to improve irradiation efficiency. Accordingly, stronger light emission can be obtained from the phosphor of the second light emitter.

When the surface emitting type one is used as the first light emitter, the second light emitter is preferably filmy. As a result, the light from the surface emitting type one has a sufficiently large cross sectional area, so that when the second light emitter is made filmy in its cross sectional direction, the cross sectional area of irradiation from the first light emitter to the phosphor increases per unit amount of the phosphor. Accordingly, the intensity of light emission from the phosphor can be more increased.

Further, when the surface emitting type one is used as the first light emitter and the filmy one is used as the second light emitter, it is preferred to take a form in which the second filmy light emitter is directly brought into contact with a light emitting surface of the first light emitter. The term "contact" as used herein means to make a state in which the first light emitter and the second light emitter are in close contact with each other without the interposition of air or gas. As a result, the loss in the amount of light that the light from the first light emitter is reflected from a film surface of the second light emitter to ooze outside can be avoided, so that the emission efficiency of the whole device can be improved.

A schematic perspective view indicating positional relationship between a first light emitter and a second light emitter in one example of a light emitting device of the present invention is shown in FIG. 1. In FIG. 1, 1 designates a second filmy light emitter having the above-mentioned phosphor, 2 designates a surface emitting type GaN-based LD as the first light emitter, and 3 designates a substrate. In order to make a state in contact with each other, the LD 2 and the second light emitter 1 are each separately prepared, and surfaces thereof may be brought into contact with each other by an adhesive or another means, or the second light emitter may be formed as a film (molded) on a light emitting surface of the LD 2. As a result, the LD 2 and the second light emitter 1 can be put into a contact state.

The light from the first light emitter and the light from the second light emitter are usually directed in all directions. However, when a powder of the phosphor of the second light emitter is dispersed in a resin, the light is partially reflected when the light goes out of the resin, thereby aligning the direction thereof to some degree. Accordingly, the light can be guided to the efficient direction to some degree, so that one in which the powder of the above-mentioned phosphor has been dispersed in the resin is preferably used. Further, when the phosphor is dispersed in the resin, the total irradiation area of the light from the first light emitter onto the second light emitter increases. It also has therefore the advantage of being able to increase emission intensity from the second light emitter. The resins which can be used in this case include various ones such as a silicon resin, an epoxy resin, a polyvinyl-based resin, a polyethylenic resin, a polypropylenic resin and a polyester-based resin. However, in terms of good dispersibility of the phosphor powder, preferred is a silicon resin or an epoxy resin.

When the powder of the second light emitter is dispersed in the resin, the weight ratio of the powder of the second light emitter to the whole of the powder and the resin is usually from 10% to 95%, preferably from 20% to 90%, and more preferably from 30% to 80%. When the phosphor is too much, emission efficiency decreases in some cases by aggregation of the powder. When it is too little, emission efficiency in turn decreases in some cases, because of absorption or scattering of the light by the resin.

The light emitting device of the present invention comprises the above-mentioned phosphor as a wavelength conversion material and the light emitting element which emits light of 350 nm to 430 nm. The above-mentioned phosphor absorbs the light of 350 nm to 430 nm emitted by the light emitting element to provide the light emitting device which has good color rendering properties without depending on use environment and can emit high-intensity visible light. The phosphor having the crystal phase of the present invention emits light in a wavelength region indicating a red color or a white color by irradiation with light from the first light emitter which emits the light of 350 nm to 430 nm. Then, the light emitting device of the present invention is suitable for a light emission source for a back light source, a traffic signal or the like, an image display unit such as a color liquid crystal display, a lighting system such as surface light emission, or the like.

Figure 2:
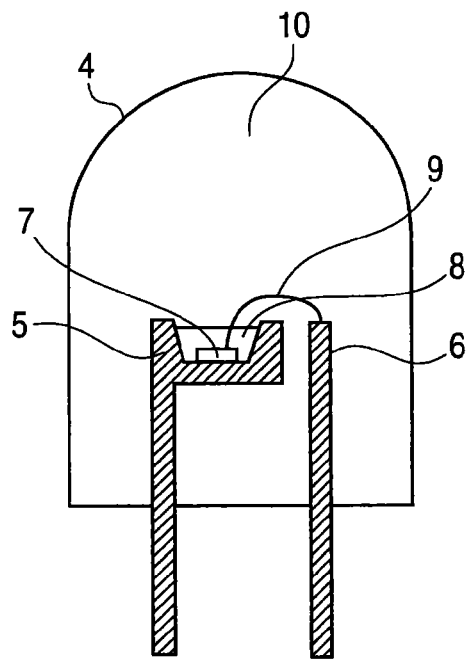
FIG. 2 is a schematic cross sectional view showing one example of a light emitting device comprising a phosphor in the present invention and a first light emitter (350 nm to 430 nm light emitter).

Illustrating the light emitting device of the present invention according to the drawing, FIG. 2 is a schematic cross sectional view showing one example of a light emitting device having a first light emitter (350 nm to 430 nm light emitter) and a second light emitter, and 4 is the light emitting device, 5 is a mount lead, 6 is an inner lead, 7 is the first light emitter (light emitter of 350 nm to 430 nm), 8 is a phosphor-containing resin portion as the second light emitter, 9 is a conductive wire, and 10 is a mold member.

The light emitting device which is one example of the present invention has a general cannonball type form as shown in FIG. 2, and the first light emitter (350 nm to 430 nm light emitter) 7 comprising a GaN-based light emitting diode and the like is fixed in an upper cup of the mount lead 5 by covering it with the phosphor-containing resin portion formed as the second light emitter by mixing and dispersing the phosphor in a binder such as a silicon resin, an epoxy resin or an acrylic resin, and pouring the dispersion into the cup. On the other hand, the first light emitter 7 and the mount lead 5, and the first light emitter 7 and the inner lead 6 are each conducted to each other with the conductive wire 9, and the whole thereof is covered and protected with the mold member 10 comprising an epoxy resin or the like.

Figure 3:
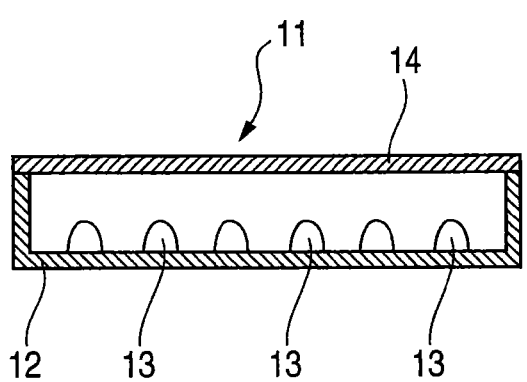
FIG. 3 is a schematic cross sectional view showing one example of a surface emitting lighting system of the present invention.

Further, in a surface emitting lighting system 11 in which this light emitting element 1 is incorporated, many light emitting devices 13 are disposed on a bottom surface of a square holding case 12 whose inner surface is made light-impermeable such as a white smooth surface, a power source, a circuit and the like (not shown) for driving the light emitting devices 13 are disposed in the outside thereof, and a diffuser panel 14 such as a milk-white acrylic plate is fixed to a portion corresponding to a lid of the holding case 12 for homogenization of light emission, as shown in FIG. 3.

Then, the surface emitting lighting system 11 is driven to apply voltage to the first light emitter of the light emitting element 13, thereby allowing light of 350 nm to 430 nm to be emitted. The light emission is partially absorbed by the above-mentioned phosphor in the phosphor-containing resin portion as the second light emitter to emit visible light. On the other hand, light emission having high color rendering properties is obtained by color mixing with blue light and the like which have not been absorbed by the phosphor. This light passes through the diffuser panel 14, and exits upward in the drawing. Thus, illuminating light having uniform brightness in a surface of the diffuser panel 14 of the holding case 12 is obtained.

EXAMPLES

The present invention will be illustrated with reference to examples in more detail below, but the present invention should not be construed as being limited to the following examples within its gist.

Example A-1

An aqueous solution of $Ba(NO_3)_2$, an aqueous solution of $Ca(NO_3)_2.4H_2O$, an aqueous solution of $Eu(NO_3)_3.6H_2O$, an aqueous solution of $Mn(NO_3)_2.6H_2O$ and a suspension of colloidal silica ($SiO_2$) (the molar ratio of $Ba(NO_3)_2$, $Ca(NO_3)_2.4H_2O$, $Eu(NO_3)_3.6H_2O$, $Mn(NO_3)_2.6H_2O$ and $SiO_2$ is 0.64:0.96:0.2:0.2:1) were mixed in a platinum container and dried. Then, the mixture was burnt by heating under a stream of nitrogen gas containing 4% of hydrogen at 1050° C. for 2 hours to produce a phosphor $Ba_{0.64}Ca_{0.96}Eu_{0.2}Mn_{0.2}SiO_4$ (phosphor used in a second light emitter). An emission spectrum at the time when this phosphor was excited at 400 nm, a main wavelength in an ultraviolet light region of a GaN-based light emitting diode, was measured. The wavelength of an emission peak thereof, the intensity of the emission peak at the time when the intensity of an emission peak of Comparative Example A-2 described later is taken as 100 (hereinafter referred to as the relative intensity), and the half-value width are shown in Table 1. This phosphor has a sufficiently wide half-value width, gives good color rendering properties, and emits a light red color having a peak wavelength within the range of 590 nm to 620 nm. This reveals that this phosphor emits reddish light which feels bright.

Comparative Example A-1

A phosphor $Ba_{0.72}Ca_{1.08}Eu_{0.2}SiO_4$ was produced in the same manner as in Example A-1 with the exception that an aqueous solution of $Ba(NO_3)_2$, an aqueous solution of $Ca(NO_3)_2.4H_2O$, an aqueous solution of $Eu(NO_3)_3.6H_2O$ and a suspension of colloidal silica ($SiO_2$) (the molar ratio of $Ba(NO_3)_2$, $Ca(NO_3)_2.4H_2O$, $Eu(NO_3)_3.6H_2O$ and $SiO_2$ is 0.72:1.08:0.2:1) were used as original solutions. An emission spectrum at the time when this phosphor was excited at 400 nm, a main wavelength in an ultraviolet light region of a GaN-based light emitting diode, was measured. The wavelength, relative intensity and half-value width of an emission peak thereof are shown in Table 1. This shows that when Mn is not added in the composition of Example A-1, no red peak appears.

Comparative Example A-2

A phosphor $Ba_{1.6}Eu_{0.2}Mn_{0.2}SiO_4$ was produced in the same manner as in Example A-1 with the exception that an aqueous solution of $Ba(NO_3)_2$, an aqueous solution of $Eu(NO_3)_3.6H_2O$, an aqueous solution of $Mn(NO_3)_2.6H_2O$ and a suspension of colloidal silica ($SiO_2$) (the molar ratio of $Ba(NO_3)_2$, $Eu(NO_3)_3.6H_2O$, $Mn(NO_3)_2.6H_2O$ and $SiO_2$ is 1.6:0.2:0.2:1) were used as original solutions. An emission spectrum at the time when this phosphor was excited at 400 nm, a main wavelength in an ultraviolet light region of a GaN-based light emitting diode, was measured. The wavelength, relative intensity and half-value width of an emission peak thereof are shown in Table 1. This shows that when Ca is not added in the composition of Example A-1, no red peak appears.

Comparative Example A-3

A phosphor $Ca_{1.6}Eu_{0.2}Mn_{0.2}SiO_4$ was produced in the same manner as in Example A-1 with the exception that an aqueous solution of $Ca(NO_3)_2.4H_2O$, an aqueous solution of $Eu(NO_3)_3.6H_2O$, an aqueous solution of $Mn(NO_3)_2.6H_2O$ and a suspension of colloidal silica ($SiO_2$) (the molar ratio of $Ca(NO_3)_2.4H_2O$, $Eu(NO_3)_3.6H_2O$, $Mn(NO_3)_2.6H_2O$ and $SiO_2$ is 1.6:0.2:0.2:1) were used as original solutions. An emission spectrum at the time when this phosphor was excited at 400 nm, a main wavelength in an ultraviolet light region of a GaN-based light emitting diode, was measured. The wavelength, relative intensity and half-value width of an emission peak thereof are shown in Table 1. This shows that when Ba is not added in the composition of Example A-1, no red peak appears.

Example A-2

A phosphor $Ba_{0.84}Ca_{0.56}Eu_{0.3}Mn_{0.3}SiO_4$ was produced in the same manner as in Example A-1 with the exception that an aqueous solution of $Ba(NO_3)_2$, an aqueous solution of $Ca(NO_3)_2.4H_2O$, an aqueous solution of $Eu(NO_3)_3.6H_2O$, an aqueous solution of $Mn(NO_3)_2.6H_2O$ and a suspension of colloidal silica ($SiO_2$) (the molar ratio of $Ba(NO_3)_2$, $Ca(NO_3)_2.4H_2O$, $Eu(NO_3)_3.6H_2O$, $Mn(NO_3)_2.6H_2O$ and $SiO_2$ is 0.84:0.56:0.3:0.3:1) were used as original solutions. An emission spectrum at the time when this phosphor was excited at 400 nm, a main wavelength in an ultraviolet light region of a GaN-based light emitting diode, was measured. The wavelength, relative intensity and half-value width of an emission peak thereof are shown in Table 1. This phosphor has a sufficiently wide half-value width, gives good color rendering properties, and emits a light red color having a peak wavelength within the range of 590 nm to 620 nm. This reveals that this phosphor emits reddish light which feels bright.

Example A-3

Figure 4:
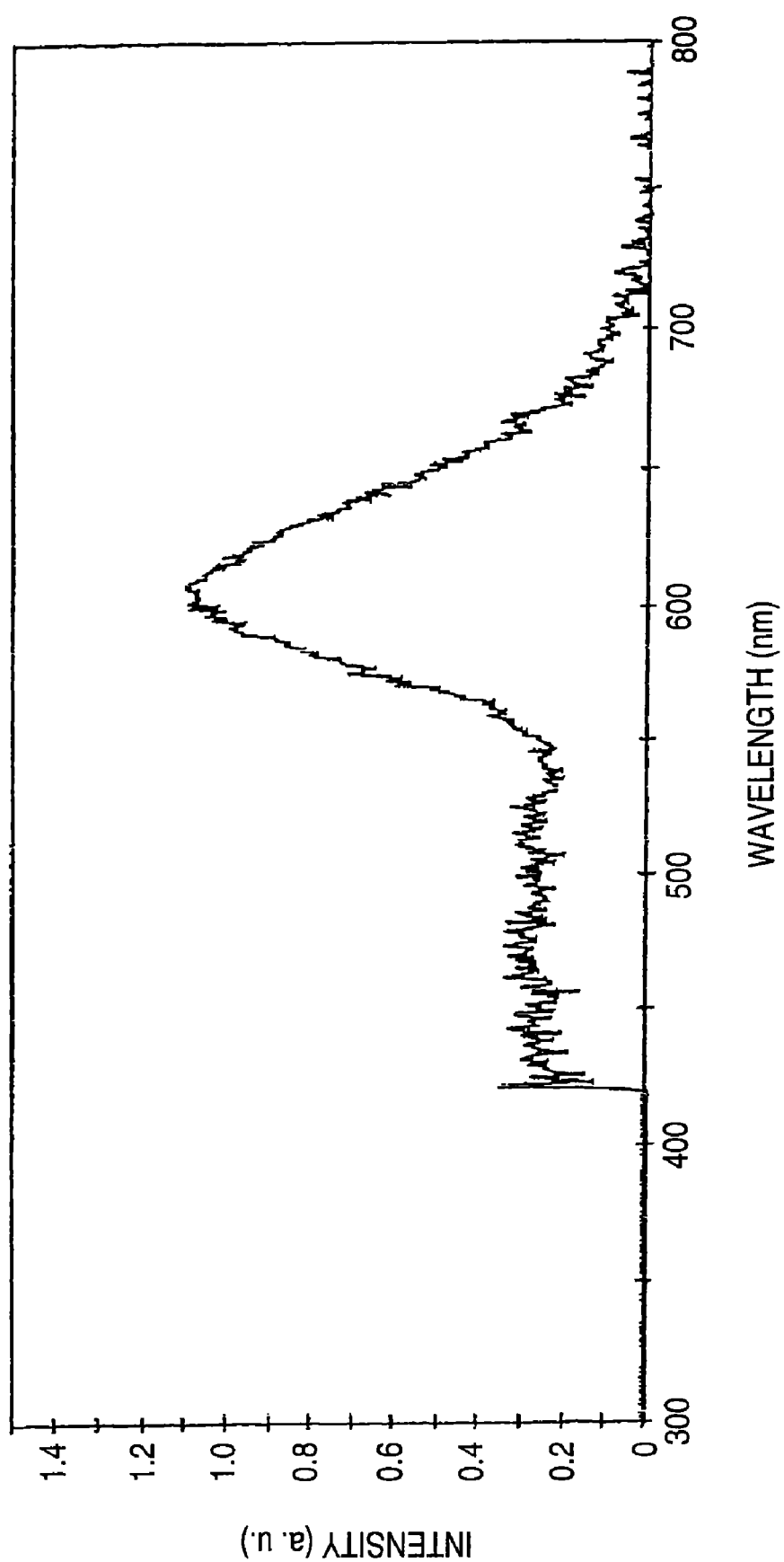
FIG. 4 is an emission spectrum of a phosphor of Example A-3 at the time when it has irradiated with light of 400 nm which is a main wavelength in an ultraviolet light region of a GaN-based light emitting diode.

A phosphor $Ba_{0.75}Ca_{0.5}Eu_{0.3}Mn_{0.45}SiO_4$ was produced in the same manner as in Example A-1 with the exception that an aqueous solution of $Ba(NO_3)_2$, an aqueous solution of $Ca(NO_3)_2.4H_2O$, an aqueous solution of $Eu(NO_3)_3.6H_2O$, an aqueous solution of $Mn(NO_3)_2.6H_2O$ and a suspension of colloidal silica ($SiO_2$) (the molar ratio of $Ba(NO_3)_2$, $Ca(NO_3)_2.4H_2O$, $Eu(NO_3)_3.6H_2O$, $Mn(NO_3)_2.6H_2O$ and $SiO_2$ is 0.75:0.5:0.3:0.45:1) were used as original solutions. An emission spectrum at the time when this phosphor was excited at 400 nm, a main wavelength in an ultraviolet light region of a GaN-based light emitting diode, was measured. The emission spectrum is shown in FIG. 4. In order to remove the influence of an excitation light source on the emission spectrum, the measurement was made introducing a filter for cutting light of 420 nm or less. The wavelength, relative intensity and half-value width of an emission peak thereof are shown in Table 1. This phosphor has a sufficiently wide half-value width, gives good color rendering properties, and emits a light red color having a peak wavelength within the range of 590 nm to 620 nm. This reveals that this phosphor emits reddish light which feels bright.

TABLE 1

| Example or Comparative Example | Chemical Composition of Phosphor | Wavelength of Emission Peak (nm) | Relative Intensity of Emission Peak | Half-Value Width of Emission Peak (nm) | Molar Ratio of Mn | Ratio of Ca to the Sum of Ba and Ca (molar ratio) |
|---|---|---|---|---|---|---|
| Example A-1 | $Ba_{0.64}Ca_{0.98}Eu_{0.2}Mn_{0.2}SiO_4$ | 605 | 108 | 80 | 0.2 | 0.6 |
| Example A-2 | $Ba_{0.84}Ca_{0.66}Eu_{0.3}Mn_{0.3}SiO_4$ | 603 | 75 | 79 | 0.3 | 0.4 |
| Example A-3 | $Ba_{0.75}Ca_{0.5}Eu_{0.3}Mn_{0.45}SiO_4$ | 607 | 36 | 79 | 0.45 | 0.4 |
| Comparative Example A-1 | $Ba_{0.72}Ca_{1.08}Eu_{0.2}SiO_4$ | 448 | 99 | 104 | 0 | 0.6 |
| Comparative Example A-2 | $Ba_{1.6}Eu_{0.2}Mn_{0.2}SiO_4$ | 509 | 100 | 62 | 0.2 | 0 |
| Comparative Example A-3 | $Ca_{1.6}Eu_{0.2}Mn_{0.2}SiO_4$ | 512 | 25 | 85 | 0.2 | 1 |

Example A-4

A phosphor $Ba_{1.11}Ca_{0.74}Eu_{0.06}Mn_{0.09}SiO_4$ was produced in the same manner as in Example A-1 with the exception that an aqueous solution of $Ba(NO_3)_2$, an aqueous solution of $Ca(NO_3)_2.4H_2O$, an aqueous solution of $Eu(NO_3)_3.6H_2O$, an aqueous solution of $Mn(NO_3)_2.6H_2O$ and a suspension of colloidal silica ($SiO_2$) (the molar ratio of $Ba(NO_3)_2$, $Ca(NO_3)_2.4H_2O$, $Eu(NO_3)_3.6H_2O$, $Mn(NO_3)_2.6H_2O$ and $SiO_2$ is 1.11:0.74:0.06:0.09:1) were used as original solutions. An emission spectrum at the time when this phosphor was excited at 400 nm, a main wavelength in an ultraviolet light region of a GaN-based light emitting diode, was measured.

Figure 5:
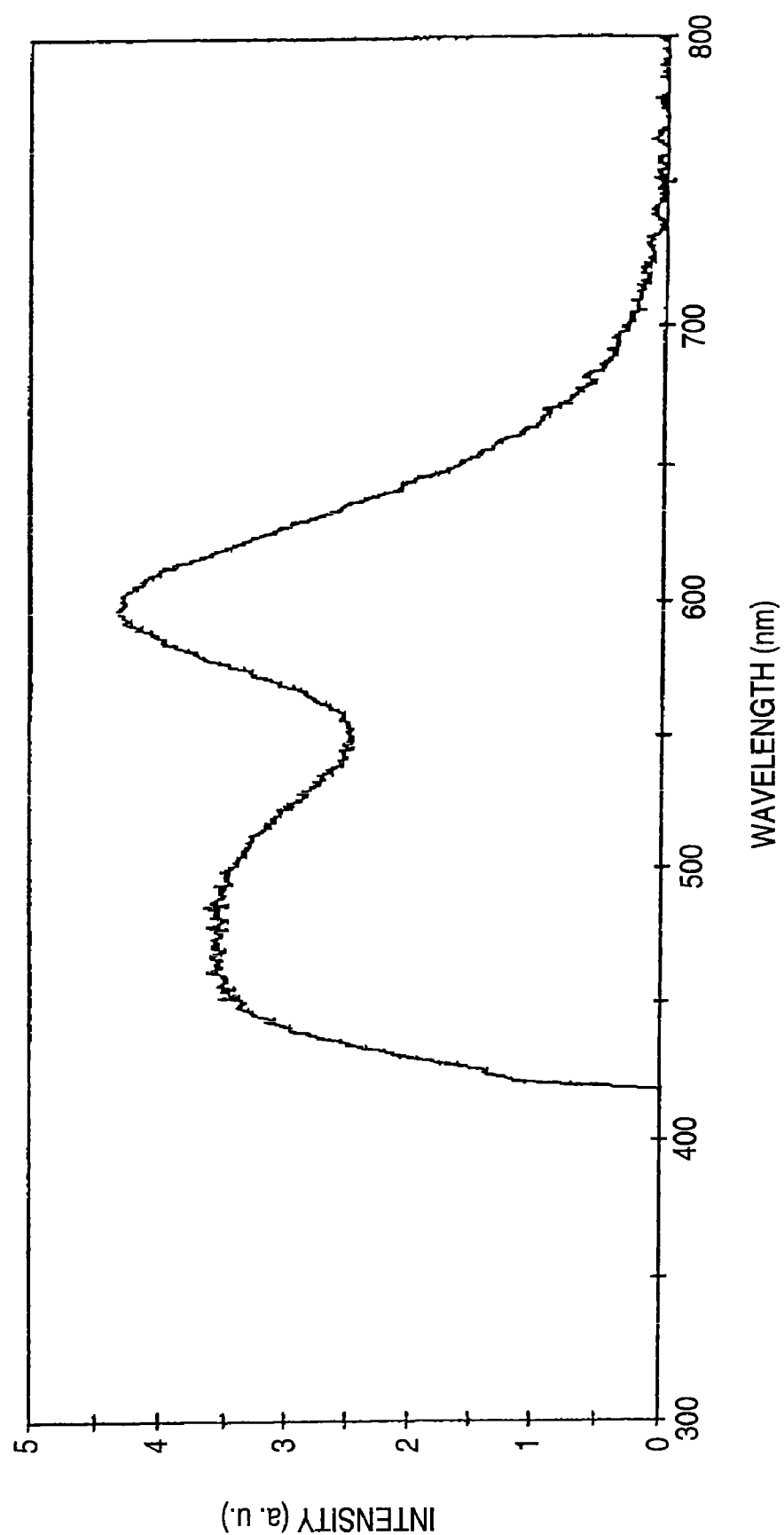
FIG. 5 is an emission spectrum of a phosphor of Example A-4 at the time when it has irradiated with light of 400 nm which is a main wavelength in an ultraviolet light region of a GaN-based light emitting diode.

An emission spectrum thereof is shown in FIG. 5. The x and y values of chromaticity coordinates indicating colors, the wavelength of the maximum peak, the intensity of the maximum peak of this phosphor at the time when the intensity of the maximum peak of a phosphor in Comparative Example A-5 described later is taken as 100 (hereinafter referred to as the relative intensity of the maximum peak), the ratio of the intensity at 600 nm to the intensity of the maximum peak, which gives an indication of to what extent a red component exists, and the half-value width of a group of peaks are shown in Table 2. This reveals that white light emission is obtained in which blue, green and red components all sufficiently exist, the spectrum width is very wide, and color rendering properties are high.

Figure 6:
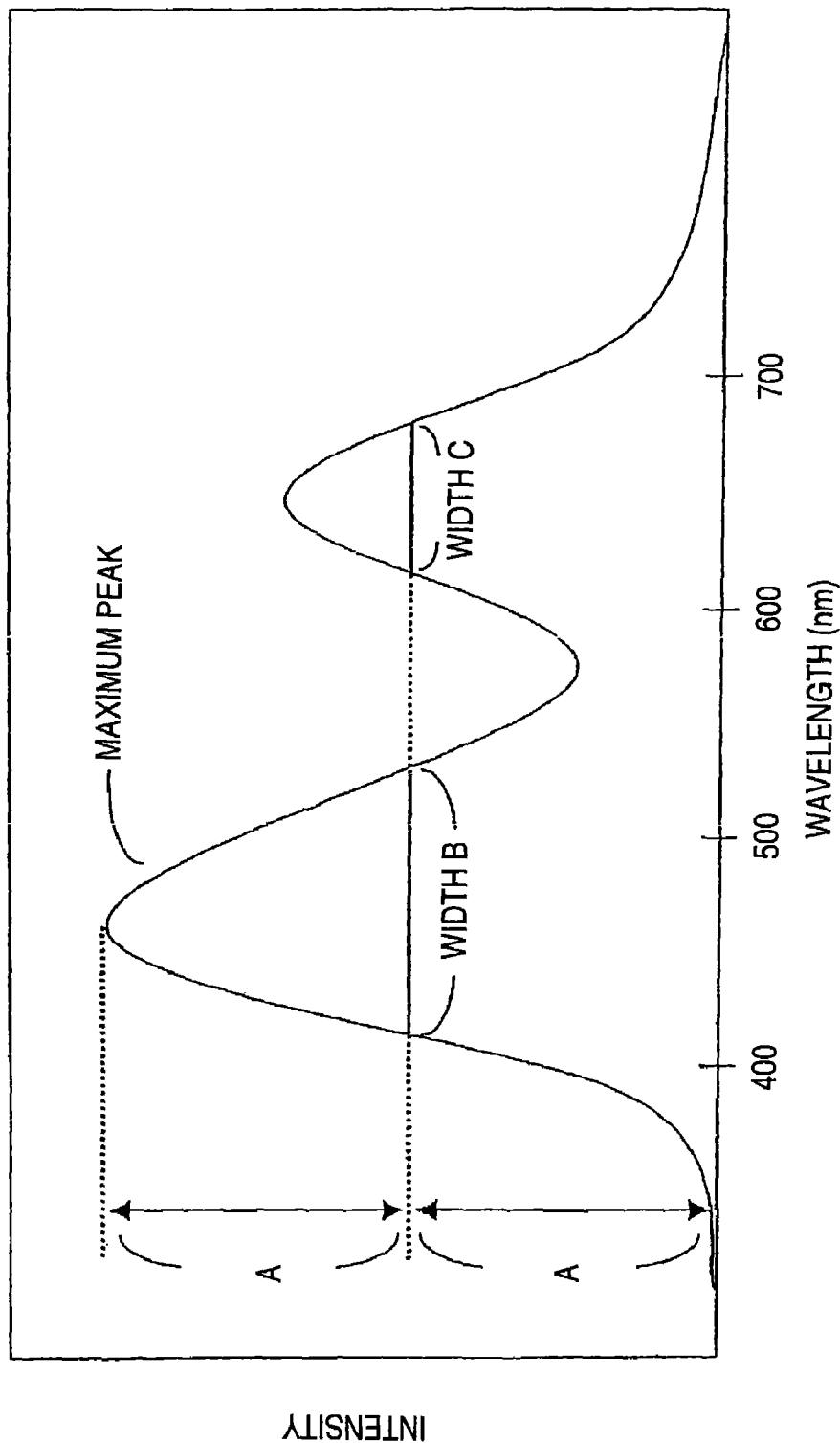
FIG. 6 is a graph showing a method for measuring the half-value width of a peak group.

The maximum peak means a peak which is highest in intensity when a plurality of peaks exist in an emission spectrum, and in the case of a single peak, the maximum peak means itself. Further, the half-value width of a group of peaks gives an indication of how wide an emission spectrum distributes, and how high color rendering properties are, and is defined as the total of widths of wavelength regions having an intensity of half or more the intensity of the maximum peak in the spectrum, as shown in FIG. 6. For example, in FIG. 6, the half-value width of a group of peaks becomes the total of width B and width C.

Example A-5

A phosphor $Ba_{0.68}Ca_{1.02}Eu_{0.2}Mn_{0.1}SiO_4$ was produced in the same manner as in Example A-1 with the exception that an aqueous solution of $Ba(NO_3)_2$, an aqueous solution of $Ca(NO_3)_2.4H_2O$, an aqueous solution of $Eu(NO_3)_3.6H_2O$, an aqueous solution of $Mn(NO_3)_2.6H_2O$ and a suspension of colloidal silica ($SiO_2$) (the molar ratio of $Ba(NO_3)_2$, $Ca(NO_3)_2.4H_2O$, $Eu(NO_3)_3.6H_2O$, $Mn(NO_3)_2.6H_2O$ and $SiO_2$ is 0.68:1.02:0.2:0.1:1) were used as original solutions. An emission spectrum at the time when this phosphor was excited at 400 nm, a main wavelength in an ultraviolet light region of a GaN-based light emitting diode, was measured. The x and y values of chromaticity coordinates, the wavelength of the maximum peak, the relative intensity of the maximum peak, the ratio of the intensity at 600 nm to the intensity of the maximum peak, and the half-value width of a group of peaks are shown in Table 2. This reveals that white light emission is obtained in which a red component sufficiently exists, the spectrum width is very wide, and color rendering properties are high.

Comparative Example A-4

A phosphor $Ba_{0.72}Ca_{1.08}Eu_{0.2}SiO_4$ was produced in the same manner as in Example A-1 with the exception that an aqueous solution of $Ba(NO_3)_2$, an aqueous solution of $Ca(NO_3)_2.4H_2O$, an aqueous solution of $Eu(NO_3)_3.6H_2O$ and a suspension of colloidal silica ($SiO_2$) (the molar ratio of $Ba(NO_3)_2$, $Ca(NO_3)_2.4H_2O$, $Eu(No_3)_3.6H_2O$ and $SiO_2$ is 0.72:1.08:0.2:1) were used as original solutions. An emission spectrum at the time when this phosphor was excited at 400 nm, a main wavelength in an ultraviolet light region of a GaN-based light emitting diode, was measured. The x and y values of chromaticity coordinates, the wavelength of the maximum peak, the relative intensity of the maximum peak, the ratio of the intensity at 600 nm to the intensity of the maximum peak, and the half-value width of a group of peaks are shown in Table 2. This reveals that when Mn is not added in the composition of Example A-5, no white spectrum is obtained.

Comparative Example A-5

A phosphor $Ba_{1.7}Eu_{0.2}Mn_{0.1}SiO_4$ was produced in the same manner as in Example A-1 with the exception that an aqueous solution of $Ba(NO_3)_2$, an aqueous solution of $Eu(NO_3)_3.6H_2O$, an aqueous solution of $Mn(NO_3)_2.6H_2O$ and a suspension of colloidal silica ($SiO_2$) (the molar ratio of $Ba(NO_3)_2$, $Eu(NO_3)_3.6H_2O$, $Mn(NO_3)_2.6H_2O$ and $SiO_2$ is 1.7:0.2:0.1:1) were used as original solutions. An emission spectrum at the time when this phosphor was excited at 400 nm, a main wavelength in an ultraviolet light region of a GaN-based light emitting diode, was measured. The x and y values of chromaticity coordinates, the wavelength of the maximum peak, the relative intensity of the maximum peak, the ratio of the intensity at 600 nm to the intensity of the maximum peak, and the half-value width of a group of peaks are shown in Table 2. This reveals that when Ca is not added in the composition of Example A-5, no white spectrum is obtained.

Comparative Example A-6

A phosphor $Ca_{1.7}Eu_{0.2}Mn_{0.1}SiO_4$ was produced in the same manner as in Example A-1 with the exception that an aqueous solution of $Ca(NO_3)_2.4H_2O$, an aqueous solution of $Eu(NO_3)_3.6H_2O$, an aqueous solution of $Mn(NO_3)_2.6H_2O$ and a suspension of colloidal silica ($SiO_2$) (the molar ratio of $Ca(NO_3)_2.4H_2O$, $Eu(NO_3)_3.6H_2O$, $Mn(NO_3)_2.6H_2O$ and $SiO_2$ is 1.7:0.2:0.1:1) were used as original solutions. An emission spectrum at the time when this phosphor was excited at 400 nm, a main wavelength in an ultraviolet light region of a GaN-based light emitting diode, was measured. The x and y values of chromaticity coordinates, the wavelength of the maximum peak, the relative intensity of the maximum peak, the ratio of the intensity at 600 nm to the intensity of the maximum peak, and the half-value width of a group of peaks are shown in Table 2. This reveals that when Ba is not added in the composition of Example A-5, no white spectrum is obtained.

Example A-6

A phosphor $Ba_{0.93}Ca_{0.62}Eu_{0.3}Mn_{0.15}SiO_4$ was produced in the same manner as in Example A-1 with the exception that an aqueous solution of $Ba(NO_3)_2$, an aqueous solution of $Ca(NO_3)_2.4H_2O$, an aqueous solution of $Eu(NO_3)_3.6H_2O$, an aqueous solution of $Mn(NO_3)_2.6H_2O$ and a suspension of colloidal silica ($SiO_2$) (the molar ratio of $Ba(NO_3)_2$, $Ca(NO_3)_2.4H_2O$, $Eu(NO_3)_3.6H_2O$, $Mn(NO_3)_2.6H_2O$ and $SiO_2$ is 0.93:0.62:0.3:0.15:1) were used as original solutions. An emission spectrum at the time when this phosphor was excited at 400 nm, a main wavelength in an ultraviolet light region of a GaN-based light emitting diode, was measured. The x and y values of chromaticity coordinates, the wavelength of the maximum peak, the relative intensity of the maximum peak, the ratio of the intensity at 600 nm to the intensity of the maximum peak, and the half-value width of a group of peaks are shown in Table 2. This reveals that white light emission is obtained in which a red component sufficiently exists, the spectrum width is very wide, and color rendering properties are high.

Example A-7

A phosphor $Ba_{1.133}Ca_{0.378}Zn_{0.189}Eu_{0.2}Mn_{0.1}SiO_4$ was produced in the same manner as in Example A-1 with the exception that an aqueous solution of $Ba(NO_3)_2$, an aqueous solution of $Ca(NO_3)_2.4H_2O$, an aqueous solution of $Zn(NO_3)_2.6H_2O$, an aqueous solution of $Eu(NO_3)_3.6H_2O$, an aqueous solution of $Mn(NO_3)_2.6H_2O$ and a suspension of colloidal silica ($SiO_2$) (the molar ratio of $Ba(NO_3)_2$, $Ca(NO_3)_2.4H_2O$, Zn $(NO_3)_2.6H_2O$, $Eu(NO_3)_3.6H_2O$, $Mn(NO_3)_2.6H_2O$ and $SiO_2$ is 1.133:0.378:0.189:0.2:0.1:1) were used as original solutions. An emission spectrum at the time when this phosphor was excited at 400 nm, a main wavelength in an ultraviolet light region of a GaN-based light emitting diode, was measured. The x and y values of chromaticity coordinates, the wavelength of the maximum peak, the relative intensity of the maximum peak, the ratio of the intensity at 600 nm to the intensity of the maximum peak, and the half-value width of a group of peaks are shown in Table 2. This reveals that white light emission is obtained in which a red component sufficiently exists, the spectrum width is very wide, and color rendering properties are high.

TABLE 2

| Example or Comparative Example | Chemical Composition of Phosphor | Chromaticity Coordinates x | Chromaticity Coordinates y | Wavelength of Maximum Peak (nm) | Relative Intensity of Maximum Peak | Intensity at 600 nm/ Intensity of Maximum Peak | Half-Value Width of Group of Peaks (nm) | Molar Ratio of Mn | Ratio of Ca to the Sum of Ba and Ca (molar ratio) |
|---|---|---|---|---|---|---|---|---|---|
| Example A-4 | $Ba_{1.11}Ca_{0.74}Eu_{0.06}Mn_{0.09}SiO_4$ | 0.346 | 0.34 | 597 | 157 | 0.984 | 208 | 0.09 | 0.4 |
| Example A-5 | $Ba_{0.68}Ca_{1.02}Eu_{0.2}Mn_{0.1}SiO_4$ | 0.375 | 0.37 | 597 | 115 | 0.997 | 194 | 0.1 | 0.6 |
| Example A-6 | $Ba_{0.93}Ca_{0.62}Eu_{0.3}Mn_{0.15}SiO_4$ | 0.351 | 0.353 | 600 | 89 | 1 | 206 | 0.15 | 0.4 |
| Example A-7 | $Ba_{1.133}Ca_{0.378}Zn_{0.189}Eu_{0.2}Mn_{0.1}SiO_4$ | 0.363 | 0.37 | 598 | 60 | 1 | 193 | 0.1 | 0.25 |
| Comparative Example A-4 | $Ba_{0.72}Ca_{1.08}Eu_{0.2}SiO_4$ | 0.19 | 0.229 | 448 | 110 | 0.12 | 104 | 0 | 0.6 |
| Comparative Example A-5 | $Ba_{1.7}Eu_{0.2}Mn_{0.1}SiO_4$ | 0.167 | 0.527 | 504 | 100 | 0.042 | 63 | 0.1 | 0 |
| Comparative Example A-6 | $Ca_{1.7}Eu_{0.2}Mn_{0.1}SiO_4$ | 0.254 | 0.421 | 504 | 42 | 0.27 | 92 | 0.1 | 1 |

Example A-8

Figure 7:
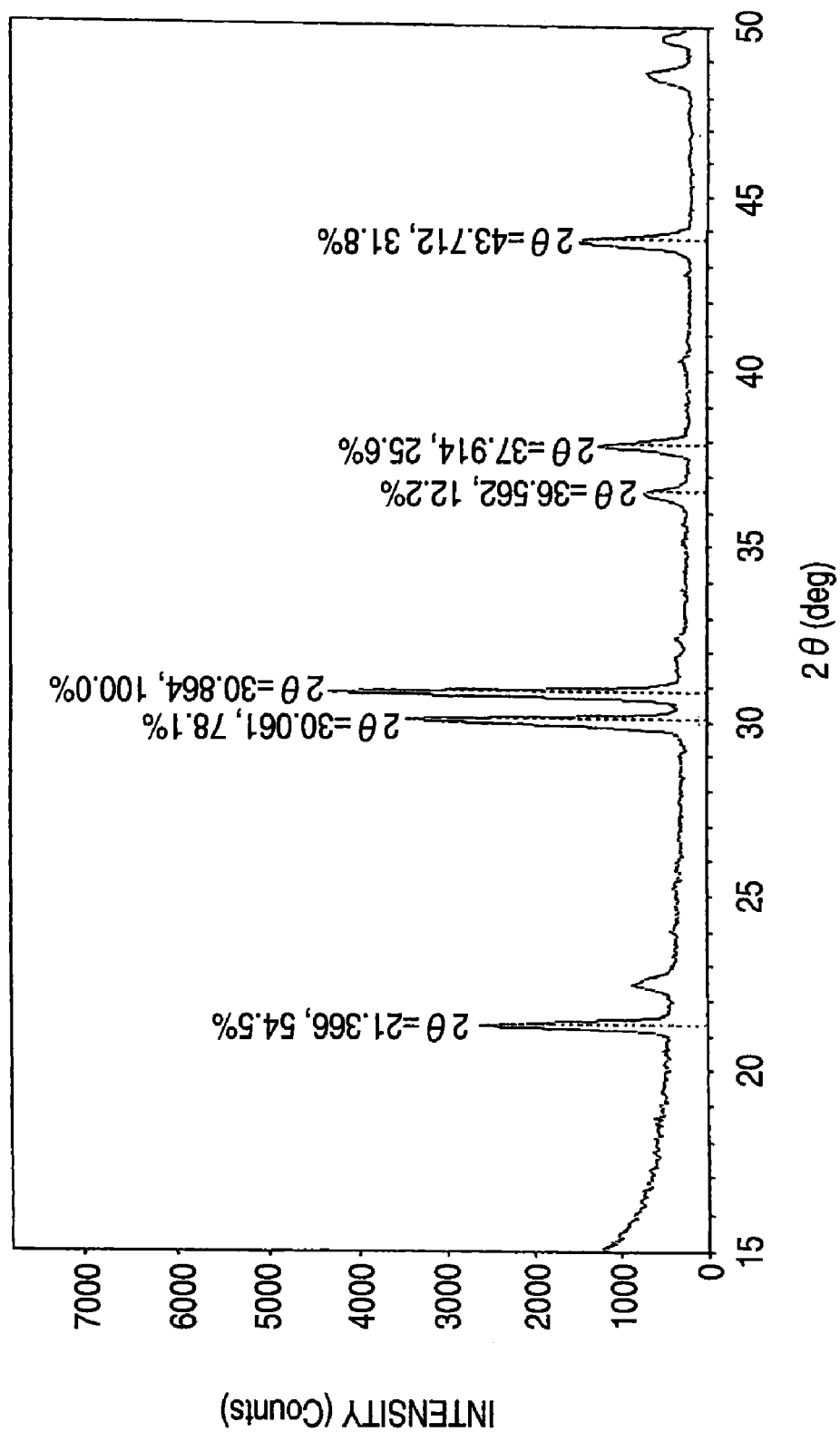
FIG. 7 shows the results of X-ray diffraction measurement of a phosphor of Example A-8.
Figure 8:
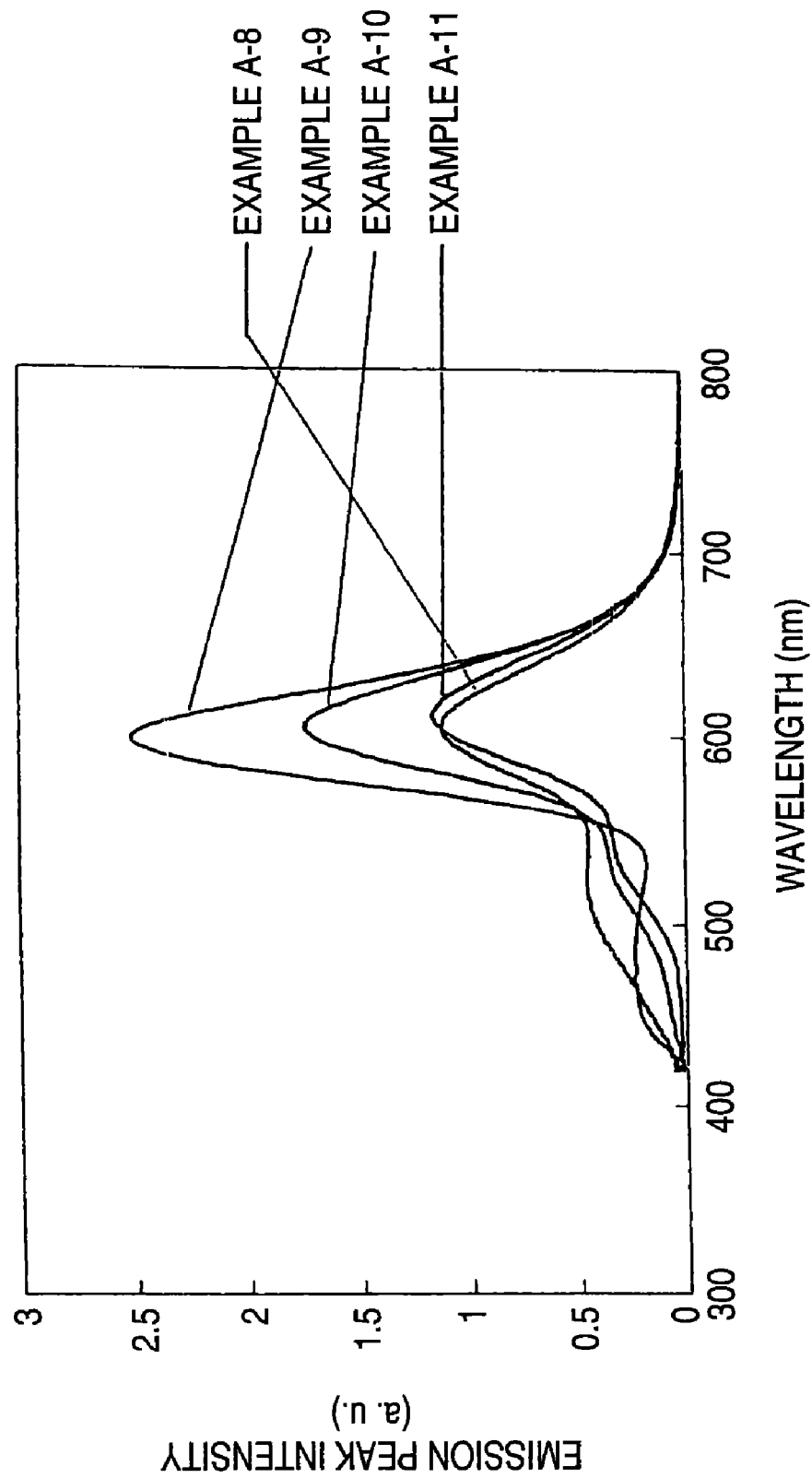
FIG. 8 is a graph showing emission spectra at the time when phosphors of Example A-8, Example A-9, Example A-10 and Example A-11 have each been irradiated with light of 400 nm which is a main wavelength in a near-ultraviolet region of a GaN-based light emitting diode.

$BaCO_3$, $CaCO_3$, $Eu_2O_3$, $MnCO_3 \cdot nH_2O$ and $SiO_2$ were weighed to a molar ratio of 1.08:0.72:0.075:0.05:1, and $NH_4Cl$ was added as a flux, followed by mixing in a ball mill for 1 hour. This prepared powder was put in an alumina crucible, further put together with this crucible in a crucible made of carbon, and heated under a stream of nitrogen gas containing 4% of hydrogen at 1200° C. for 6 hours, thereby producing a phosphor $Ba_{1.08}Ca_{0.72}Eu_{0.15}Mn_{0.05}SiO_4$. X-ray diffraction measurement of this phosphor was made under the following conditions. Powder X-ray diffraction measurement was performed using a Bragg-Brentano type powder X-ray diffractometer comprising CuKα as an X-ray source which was optically adjusted to Δ2θ=0.05° or less in the diffraction angle error in a scanning range, under conditions in which the angle reproducibility was assured in which the error of the diffraction angle associated with sample eccentricity is Δ2θ=0.05° or less using the 111 peak of standard silicon. Further, the divergence angle of a divergence slit was adjusted so that the irradiation width of the X-ray did not exceed the width of the sample in measurement, and for the diffraction peak position (peak top) and diffraction intensity (height), values of the results of measurement in a stationary slit mode was read. The results of X-ray diffraction measurement are shown in FIG. 7. Table 3 shows that the obtained phosphor meets the conditions described in claim 6, and it was confirmed that the specified phase described above was contained. An emission spectrum at the time when this phosphor was excited at 400 nm, a main wavelength in an ultraviolet light region of a GaN-based light emitting diode, is shown in FIG. 8. In order to remove the influence of an excitation light source on the emission spectrum, light of 420 nm or less was cut. The x and y values of chromaticity coordinates, wavelength of emission peak and intensity of emission peak of this phosphor are shown in Table 4.

Example A-9

A phosphor $Ba_{1.35}Ca_{0.45}Eu_{0.15}Mn_{0.05}SiO_4$ was obtained in the same manner as in Example A-8 with the exception that $BaCo_3$, $CaCO_3$, $Eu_2O_3$, $MnCO_3 \cdot nH_2O$ and $SiO_2$ were weighed to a molar ratio of 1.35:0.45:0.075:0.05:1. The results of X-ray diffraction measurement are shown in Table 3, and this example meets the conditions of claim 6. An emission spectrum is shown in FIG. 8, and characteristics are summarized in Table 4.

Example A-10

A phosphor $Ba_{1.35}Ca_{0.45}Eu_{0.15}Mn_{0.05}Si)_4$ was obtained in the same manner as in Example A-8 with the exception that $BaCO_3$, $CaCO_3$, $SrCo_3$, $Eu_2O_3$, $MnCO_3 \cdot nH_2O$ and $SiO_2$ were weighed to a molar ratio of 1.20:0.4:0.2:0.075:0.05:1. The results of X-ray diffraction measurement are shown in Table 3, and this example meets the conditions of claim 6. An emission spectrum is shown in FIG. 8, and characteristics are summarized in Table 4.

Example A-11

A phosphor $Ba_{1.08}Ca_{0.36}Sr_{0.36}Eu_{0.15}Mn_{0.05}Si_4$ was obtained in the same manner as in Example A-8 with the exception that $BaCO_3$, $CaCO_3$, $SrCO_3$, $Eu_2O_3$, $MnCO_3 \cdot nH_2O$ and $SiO_2$ were weighed to a molar ratio of 1.08:0.36:0.36:0.075:0.05:1. The results of X-ray diffraction measurement are shown in Table 3, and this example meets the conditions of claim 6. An emission spectrum is shown in FIG. 8, and characteristics are summarized in Table 4.

TABLE 3

| Reference Diffraction Peak Angle | Angle Range | Start Angle | End Angle | Measured Angle | Measured Relative Intensity |
|---|---|---|---|---|---|
| Example A-8 | | | | | |
| 21.366 | R1 | 29.537 | 30.148 | 30.061 | 78.1 |
| Intensity | R2 | 30.490 | 31.122 | 30.864 | 100.0 |
| 54.5 | R3 | 36.122 | 36.878 | 36.562 | 12.2 |
| | R4 | 37.432 | 38.217 | 37.914 | 25.6 |
| | R5 | 43.071 | 43.986 | 43.712 | 31.8 |
| Example A-9 | | | | | |
| 21.553 | R1 | 29.799 | 30.415 | 30.227 | 73.7 |
| Intensity | R2 | 30.761 | 31.398 | 31.085 | 100.0 |
| 49.4 | R3 | 36.446 | 37.209 | 36.666 | 17.6 |
| | R4 | 37.767 | 38.560 | 38.130 | 26.6 |
| | R5 | 43.463 | 44.387 | 43.857 | 28.4 |
| Example A-10 | | | | | |
| 21.614 | R1 | 29.884 | 30.502 | 30.331 | 93.0 |
| Intensity | R2 | 30.849 | 31.488 | 31.173 | 100.0 |
| 51.3 | R3 | 36.551 | 37.317 | 36.856 | 13.2 |
| | R4 | 37.877 | 38.672 | 38.248 | 31.7 |
| | R5 | 43.590 | 44.518 | 44.035 | 38.4 |

TABLE 3-continued

| Reference Diffraction Peak Angle | Angle Range | Start Angle | End Angle | Measured Angle | Measured Relative Intensity |
|---|---|---|---|---|---|
| Example A-11 | | | | | |
| 21.702 | R1 | 30.007 | 30.628 | 30.448 | 100.0 |
| Intensity | R2 | 30.976 | 31.618 | 31.262 | 96.7 |
| 42.7 | R3 | 36.512 | 37.276 | 37.243 | 16.3 |
| | R4 | 38.035 | 38.834 | 38.381 | 29.4 |
| | R5 | 43.775 | 44.706 | 44.197 | 32.2 |

TABLE 4

| Example | Chemical Composition of Phosphor | Chromaticity Coordinates | | Wavelength of Emission Peak (nm) | Intensity of Emission Peak (arbitrary scale) |
|---|---|---|---|---|---|
| | | x | y | | |
| Example A-8 | $Ba_{1.08}Ca_{0.72}Eu_{0.15}Mn_{0.05}SiO_4$ | 0.461 | 0.414 | 605 | 113 |
| Example A-9 | $Ba_{1.35}Ca_{0.45}Eu_{0.15}Mn_{0.05}SiO_4$ | 0.537 | 0.389 | 601 | 251 |
| Example A-10 | $Ba_{1.20}Ca_{0.4}Sr_{0.2}Eu_{0.15}Mn_{0.05}SiO_4$ | 0.538 | 0.415 | 605 | 175 |
| Example A-11 | $Ba_{1.08}Ca_{0.36}Sr_{0.36}Eu_{0.15}Mn_{0.05}SiO_4$ | 0.541 | 0.427 | 613 | 113 |

Example B-1

An aqueous solution of $Ba(NO_3)_2$, an aqueous solution of $Ca(NO_3)_2.4H_2O$, an aqueous solution of $Mg(NO_3)_2.6H_2O$, an aqueous solution of $Eu(NO_3)_3.6H_2O$, an aqueous solution of $Mn(NO_3)_2.6H_2O$ and a suspension of colloidal silica $(SiO_2)$ (the molar ratio of $Ba(NO_3)_2$, $Ca(NO_3)_2.4H_2O$, $Mg(NO_3)_2.6H_2O$, $Eu(NO_3)_3.6H_2O$, $Mn(NO_3)_2.6H_2O$ and $SiO_2$ is 1.133:0.378:0.189:0.2:0.1:1) were mixed in a platinum container and dried. Then, the mixture was burnt by heating under a stream of nitrogen gas containing 4% of hydrogen at 1050° C. for 2 hours to produce a phosphor $Ba_{1.133}Ca_{0.378}Mg_{0.189}Eu_{0.2}Mn_{0.1}SiO_4$ (phosphor used in a second light emitter). An emission spectrum at the time when this phosphor was excited at 400 nm, a main wavelength in an ultraviolet light region of a GaN-based light emitting diode, was measured. The wavelength of an emission peak thereof, the intensity of the emission peak at the time when the intensity of an emission peak of Comparative Example B-3 described later is taken as 100 (hereinafter referred to as the relative intensity), and the half-value width are shown in Table 5. This phosphor has a sufficiently wide half-value width, gives good color rendering properties, and emits a light red color having a peak wavelength within the range of 590 nm to 620 nm. This reveals that this phosphor emits reddish light which feels bright.

Comparative Example B-1

A phosphor $Ba_{1.2}Ca_{0.4}Mg_{0.2}Eu_{0.2}SiO_4$ was produced in the same manner as in Example B-1 with the exception that an aqueous solution of $Ba(NO_3)_2$, an aqueous solution of $Ca(NO_3)_2.4H_2O$, an aqueous solution of $Mg(NO_3)_2.6H_2O$, an aqueous solution of $Eu(NO_3)_3.6H_2O$ and a suspension of colloidal silica $(SiO_2)$ (the molar ratio of $Ba(NO_3)_2$, $Ca(NO_3)_2.4H_2O$, $Mg(NO_3)_2.6H_2O$, $Eu(NO_3)_3.6H_2O$ and $SiO_2$ is 1.2:0.4:0.2:0.2;1) were used as original solutions. An emission spectrum at the time when this phosphor was excited at 400 nm, a main wavelength in an ultraviolet light region of a GaN-based light emitting diode, was measured. The wavelength, relative intensity and half-value width of an emission peak thereof are shown in Table 5. This shows that when Mn is not added in the composition of Example B-1, no red peak appears.

Comparative Example B-2

A phosphor $Ba_{0.72}Ca_{1.08}Eu_{0.2}SiO_4$ was produced in the same manner as in Example B-1 with the exception that an aqueous solution of $Ba(NO_3)_2$, an aqueous solution of $Ca(NO_3)_2.4H_2O$, an aqueous solution of $Eu(NO_3)_3.6H_2O$ and a suspension of colloidal silica $(SiO_2)$ (the molar ratio of $Ba(NO_3)_2$, $Ca(NO_3)_2.4H_2O$, $Eu(NO_3)_3.6H_2O$ and $SiO_2$ is 0.72:1.08:0.2:1) were used as original solutions. An emission spectrum at the time when this phosphor was excited at 400 nm, a main wavelength in an ultraviolet light region of a GaN-based light emitting diode, was measured. The wavelength, relative intensity and half-value width of an emission peak thereof are shown in Table 5. This shows that no red peak appears in crystals containing no Mn component or no Mg component.

Comparative Example B-3

A phosphor $Ba_{1.6}Eu_{0.2}Mn_{0.2}SiO_4$ was produced in the same manner as in Example B-1 with the exception that an aqueous solution of $Ba(NO_3)_2$, an aqueous solution of $Eu(NO_3)_3.6H_2O$, an aqueous solution of $Mn(NO_3)_2.6H_2O$ and a suspension of colloidal silica $(SiO_2)$ (the molar ratio of $Ba(NO_3)_2$, $Eu(NO_3)_3.6H_2O$, $Mn(NO_3)_2.6H_2O$ and $SiO_2$ is 1.6:0.2:0.2:1) were used as original solutions. An emission spectrum at the time when this phosphor was excited at 400 nm, a main wavelength in an ultraviolet light region of a GaN-based light emitting diode, was measured. The wavelength, relative intensity and half-value width of an emission peak thereof are shown in Table 5. This shows that even though Mn is contained in crystals, when Ca or Mg is not contained, no red peak appears.

Comparative Example B-4

A phosphor $Ca_{1.6}Eu_{0.2}Mn_{0.2}SiO_4$ was produced in the same manner as in Example B-1 with the exception that an aqueous solution of $Ca(NO_3)_2.4H_2O$, an aqueous solution of $Eu(NO_3)_3.6H_2O$, an aqueous solution of $Mn(NO_3)_2.6H_2O$ and a suspension of colloidal silica $(SiO_2)$ (the molar ratio of $Ca(NO_3)_2.4H_2O$, $Eu(NO_3)_3.6H_2O$, $Mn(NO_3)_2.6H_2O$ and $SiO_2$ is 1.6:0.2:0.2:1) were used as original solutions. An emission spectrum at the time when this phosphor was excited at 400 nm, a main wavelength in an ultraviolet light region of a GaN-based light emitting diode, was measured. The wavelength, relative intensity and half-value width of an emission peak thereof are shown in Table 5. This shows that even though Mn is contained in crystals, when Ba or Mg is not contained, no red peak appears.

Comparative Example B-5

A phosphor $Ba_{0.587}Mg_{1.173}Eu_{0.2}Mn_{0.04}SiO_4$ was produced in the same manner as in Example B-1 with the exception that an aqueous solution of $Ba(NO_3)_2$, an aqueous solution of $Mg(NO_3)_2.6H_2O$, an aqueous solution of $Bu(NO_3)_3.6H_2O$, an aqueous solution of $Mn(NO_3)_2.6H_2O$ and a suspension of colloidal silica ($SiO_2$) (the molar ratio of $Ba(NO_3)_2$, $Mg(NO_3)_2.6H_2O$, $Eu(NO_3)_3.6h_2O$, $Mn(NO_3)_2.6H_2O$ and $SiO_2$ is 0.587:1.173:0.2:0.04:1) were used as original solutions. An emission spectrum at the time when this phosphor was excited at 400 nm, a main wavelength in an ultraviolet light region of a GaN-based light emitting diode, was measured. The wavelength, relative intensity and half-value width of an emission peak thereof are shown in Table 5. This shows that when Ca does not exist in an adequate amount based on Ba in crystals, the wavelength of emission peak exceeds 620 nm to cause failure to emit reddish light which feels bright.

the time when the intensity of the maximum peak of a phosphor in Comparative Example B-7 described later is taken as 100 (hereinafter referred to as the relative intensity of the maximum peak), the ratio of the intensity at 600 nm to the intensity of the maximum peak, which gives an indication of to what extent a red component exists, and the half-value width of a group of peaks are shown in Table 6. This reveals that white light emission is obtained in which blue, green and red components all sufficiently exist, the spectrum width is very wide, and color rendering properties are high.

The maximum peak means a peak which is highest in intensity when a plurality of peaks exist in an emission spectrum, and in the case of a single peak, the maximum peak means itself. Further, the half-value width of a group of peaks gives an indication of how wide an emission spectrum distributes, and how high color rendering properties are, and is defined as the total of widths of wavelength regions having an intensity of half or more the intensity of the maximum peak in the spectrum, as shown in FIG. 6.

Comparative Example B-6

A phosphor $Ba_{1.2}Ca_{0.4}Mg_{0.2}Eu_{0.2}SiO_4$ was produced in the same manner as in Example B-1 with the exception that an aqueous solution of $Ba(NO_3)_2$, an aqueous solution of $Ca(NO_3)_2.4H_2O$, an aqueous solution of $Mg(NO_3)_2.6H_2O$, an aqueous solution of $Eu(NO_3)_3.6H_2O$ and a suspension of colloidal silica ($SiO_2$) (the molar ratio of $Ba(NO_3)_2$,

TABLE 5

| Example or Comparative Example | Chemical Composition of Phosphor | Wavelength of Emission Peak (nm) | Relative Intensity of Emission Peak | Half-Value Width of Emission Peak (nm) | Molar Ratio of Mn | Ratio of Mg to the Sum of Divalent Element Except Eu and Mn, Monovalent, Trivalent and Pentavalent Elements (molar ratio) | Ratio of Ca to the Sum of Ba and Ca (molar ratio) |
|---|---|---|---|---|---|---|---|
| Example B-1 | $Ba_{1.133}Ca_{0.378}Mg_{0.189}Eu_{0.2}Mn_{0.1}SiO_4$ | 602 | 147 | 73 | 0.1 | 0.11 | 0.25 |
| Comparative Example B-1 | $Ba_{1.2}Ca_{0.4}Mg_{0.2}Eu_{0.2}SiO_4$ | 496 | 183 | 122 | 0 | 0.11 | 0.25 |
| Comparative Example B-2 | $Ba_{0.72}Ca_{1.08}Eu_{0.2}SiO_4$ | 448 | 99 | 104 | 0 | 0 | 0.60 |
| Comparative Example B-3 | $Ba_{1.6}Eu_{0.2}Mn_{0.2}SiO_4$ | 509 | 100 | 62 | 0.2 | 0 | 0.00 |
| Comparative Example B-4 | $Ca_{1.6}Eu_{0.2}Mn_{0.2}SiO_4$ | 512 | 25 | 85 | 0.2 | 0 | 1.00 |
| Comparative Example B-5 | $Ba_{0.587}Mg_{1.173}Eu_{0.2}Mn_{0.04}SiO_4$ | 630 | 94 | 74 | 0.04 | 0.67 | 0.00 |

Example B-2

Figure 9:
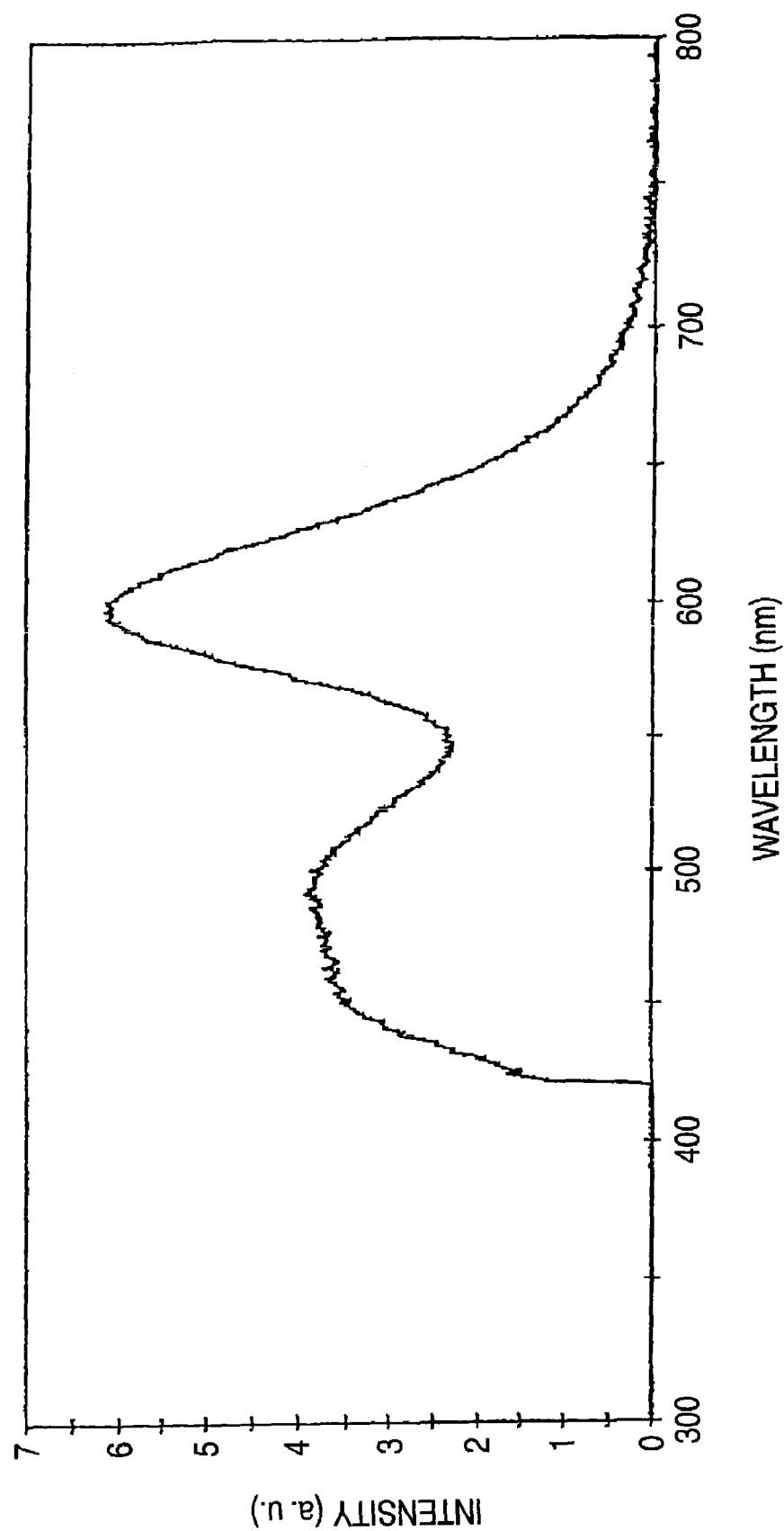
FIG. 9 is an emission spectrum of a phosphor of Example B-2 at the time when it has irradiated with light of 400 nm which is a main wavelength in an ultraviolet light region of a GaN-based light emitting diode.

A phosphor $Ba_{1.173}Ca_{0.391}Mg_{0.196}Eu_{0.2}Mn_{0.04}SiO_4$ was produced in the same manner as in Example B-1 with the exception that an aqueous solution of $Ba(NO_3)_2$, an aqueous solution of $Ca(NO_3)_2.4H_2O$, an aqueous solution of $Mg(NO_3)_2.6H_2O$, an aqueous solution of $Eu(NO_3)_3.6H_2O$, an aqueous solution of $Mn(NO_3)_2.6H_2O$ and a suspension of colloidal silica ($SiO_2$) (the molar ratio of $Ba(NO_3)_2$, $Ca(NO_3)_2.4H_2O$, $Mg(NO_3)_2.6H_2O$, $Eu(NO_3)_3.6H_2O$, $Mn(NO_3)_2.6H_2O$ and $SiO_2$ is 1.173:0.391:0.196:0.2:0.04:1) were used as original solutions. An emission spectrum at the time when this phosphor was excited at 400 nm, a main wavelength in an ultraviolet light region of a GaN-based light emitting diode, was measured. An emission spectrum thereof is shown in FIG. 9. The x and y values of chromaticity coordinates indicating colors, the wavelength of the maximum peak, the intensity of the maximum peak of this phosphor at $Ca(NO_3)_2.4H_2O$, $Mg(NO_3)_2.6H_2O$, $Eu(NO_3)_3.6H_2O$ and $SiO_2$ is 1.2:0.4:0.2:0.2:1) were used as original solutions. An emission spectrum at the time when this phosphor was excited at 400 nm, a main wavelength in an ultraviolet light region of a GaN-based light emitting diode, was measured. The x and y values of chromaticity coordinates, the wavelength of the maximum peak, the intensity of the maximum peak, the ratio of the intensity at 600 nm to the intensity of the maximum peak, and the half-value width of a group of peaks are shown in Table 6. This reveals that when Mn is not added in the composition of Example B-5, no white spectrum is obtained.

Comparative Example B-7

A phosphor $Ba_{0.72}Ca_{1.08}Eu_{0.2}SiO_4$ was produced in the same manner as in Example B-1 with the exception that an aqueous solution of $Ba(NO_3)_2$, an aqueous solution of $Ca(NO_3)_2.4H_2O$, an aqueous solution of $Eu(NO_3)_3.6H_2O$ and a suspension of colloidal silica ($SiO_2$) (the molar ratio of $Ba(NO_3)_2$, $Ca(NO_3)_2 \cdot 4H_2O$, $Eu(NO_3)_3 \cdot 6H_2O$ and $SiO_2$ is 0.72:1.08:0.2:1) were used as original solutions. An emission spectrum at the time when this phosphor was excited at 400 nm, a main wavelength in an ultraviolet light region of a GaN-based light emitting diode, was measured. The x and y values of chromaticity coordinates, the wavelength of the maximum peak, the intensity of the maximum peak, the ratio of the intensity at 600 nn to the intensity of the maximum peak, and the half-value width of a group of peaks are shown in Table 6. This reveals that when Mn or Mg does not exist in crystals, no white spectrum is obtained.

Comparative Example B-8

Figure 10:
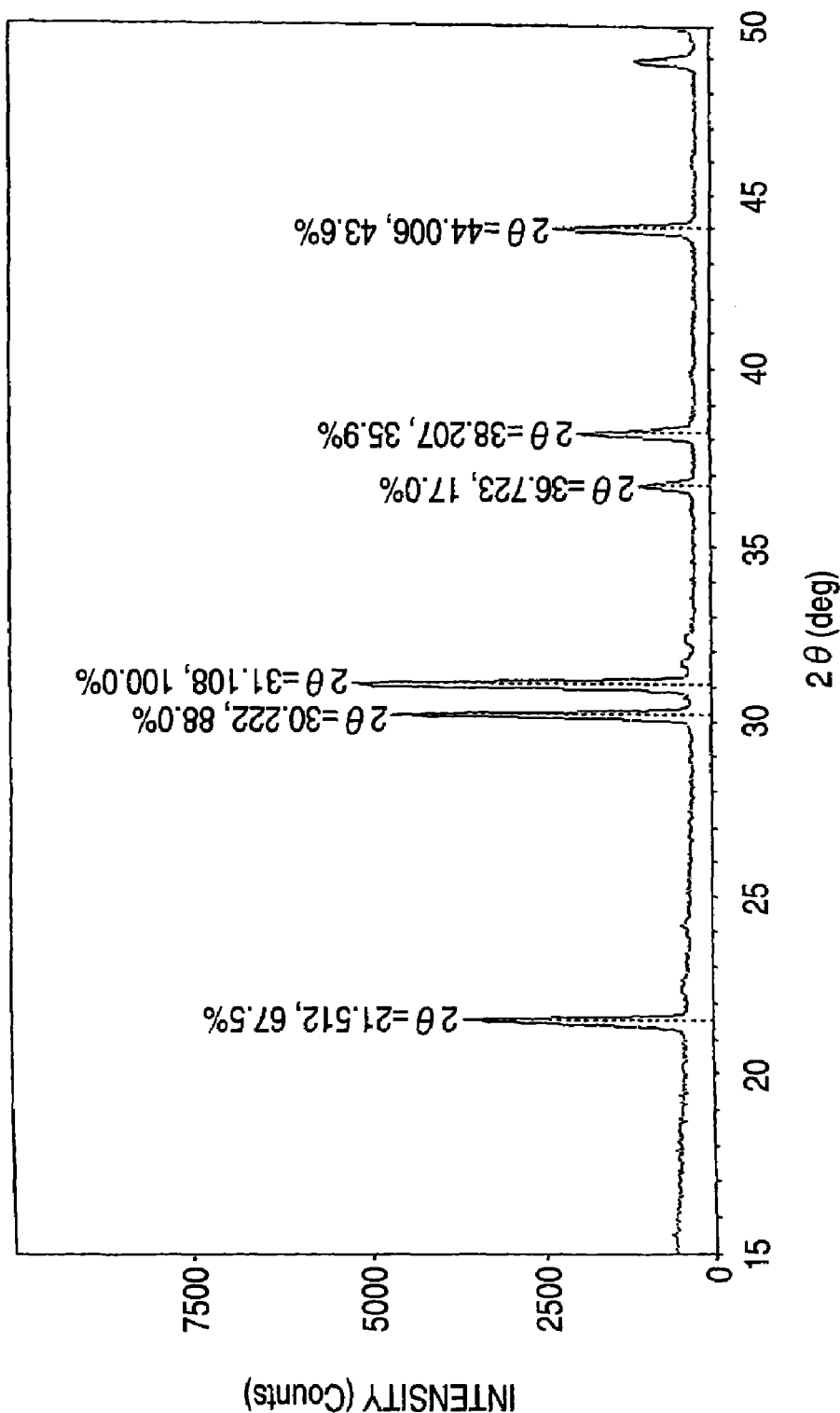
FIG. 10 shows the results of X-ray diffraction measurement of a phosphor of Example B-3.
Figure 11:
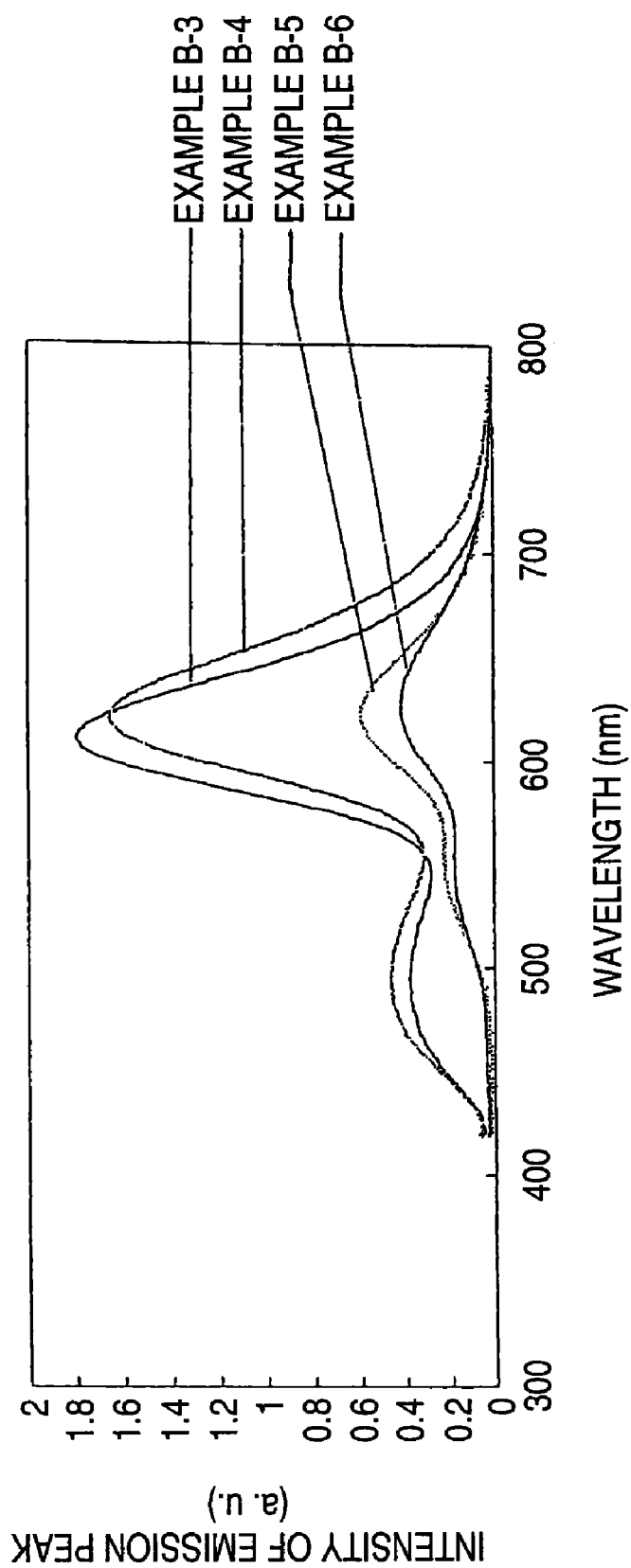
FIG. 11 is a graph showing emission spectra at the time when phosphors of Example B-3, Example B-4, Example B-5 and Example B-6 have each been irradiated with light of 400 nm which is a main wavelength in a near-ultraviolet light region of a GaN-based light emitting diode.

A phosphor $Ba_{0.587}Mg_{1.173}Eu_{0.2}Mn_{0.04}SiO_4$ was produced in the same manner as in Example B-1 with the exception that an aqueous solution of $Ba(NO_3)_2$, an aqueous solution of $Mg(NO_3)_2 \cdot 6H_2O$, an aqueous solution of $Eu(NO_3)_3 \cdot 6H_2O$, an aqueous solution of $Mn(NO_3)_2 \cdot 6H_2O$ and a suspension of colloidal silica ($SiO_2$) (the molar ratio of $Ba(NO_3)_2$, $Mg(NO_3)_2 \cdot 6H_2O$, $Eu(NO_3)_3 \cdot 6H_2O$, $Mn(NO_3)_2 \cdot 6H_2O$ and $SiO_2$ is 0.587:1.173:0.2:0.04:1) were used as original solutions. An emission spectrum at the time when this phosphor was excited at 400 nm, a main wavelength in an ultraviolet light region of a GaN-based light emitting diode, was measured. The x and y values of chromaticity coordinates, the wavelength of the maximum peak, the intensity of the maximum peak, the ratio of the intensity at 600 nm to the intensity of the maximum peak, and the half-value width of a group of peaks are shown in Table 6. When Ca does not exist in an adequate amount based on Ba in crystals, the wavelength of a red peak exceeds 620 nm to obtain a visible light spectrum containing no reddish component which feels bright.

hours, thereby producing a phosphor $Ba_{1.283}Ca_{0.428}Mg_{0.09}Eu_{0.15}Mn_{0.05}SiO_4$. X-ray diffraction measurement of this phosphor was made under the following conditions. Powder X-ray diffraction measurement was performed using a Bragg-Brentano type powder X-ray diffractometer comprising CuKα as an X-ray source which was optically adjusted to $\Delta 2\theta = 0.05°$ or less in the diffraction angle error in a scanning range, under conditions in which the angle reproducibility was assured in which the error of the diffraction angle associated with sample eccentricity is $\Delta 2\theta = 0.05°$ or less using the Ill peak of standard silicon. Further, the divergence angle of a divergence slit was adjusted so that the irradiation width of the X-ray did not exceed the width of the sample in measurement, and for the diffraction peak position (peak top) and diffraction intensity (height), values of the results of measurement in a stationary slit mode was read. The results of X-ray diffraction measurement are shown in FIG. 10. Table 7 shows that the obtained phosphor meets the conditions described in claim 6, and it was confirmed that the specified phase described above was contained. An emission spectrum at the time when this phosphor was excited at 400 nm, a main wavelength in an ultraviolet light region of a GaN-based light emitting diode, is shown in FIG. 11. In order to remove the influence of an excitation light source on the emission spectrum, light of 420 nm or less is cut. The x and y values of chromaticity coordinates, wavelength of emission peak and intensity of emission peak of this phosphor are shown in Table 8.

Example B-4

A phosphor $Ba_{1.215}Ca_{0.405}Mg_{0.18}Eu_{0.15}Mn_{0.05}SiO_4$ was obtained in the same manner as in Example B-3 with the exception that $BaCO_3$, $CaCO_3$, $MgCO_3$, $Eu_2O_3$, $MnCO_3 \cdot nH_2O$ and $SiO_2$ were weighed to a molar ratio of

TABLE 6

| Example or Comparative Example | Chemical Composition of Phosphor | Chromaticity Coordinates x | Chromaticity Coordinates y | Wavelength of Maximum Peak (nm) | Relative Intensity of Maximum Peak | Intensity at 600 nm/ Intensity of Maximum Peak | Half-Value Width of Group of Peaks (nm) | Molar Ratio of Mn | Ratio of Mg to the Sum of Divalent Element Except Eu and Mn, Monovalent, Trivalent and Pentavalent Elements (molar ratio) | Ratio of Ca to the Sum of Ba and Ca (molar ratio) |
|---|---|---|---|---|---|---|---|---|---|---|
| Example B-2 | $Ba_{1.173}Ca_{0.391}Mg_{0.196}Eu_{0.2}Mn_{0.04}SiO_4$ | 0.376 | 0.345 | 598 | 202 | 1 | 158 | 0.04 | 0.11 | 0.25 |
| Comparative Example B-6 | $Ba_{1.2}Ca_{0.4}Mg_{0.2}Eu_{0.2}SiO_4$ | 0.184 | 0.29 | 496 | 186 | 0.08 | 122 | 0 | 0.11 | 0.25 |
| Comparative Example B-7 | $Ba_{0.72}Ca_{1.08}Eu_{0.2}SiO_4$ | 0.19 | 0.229 | 448 | 100 | 0.12 | 104 | 0 | 0 | 0.60 |
| Comparative Example B-8 | $Ba_{0.587}Mg_{1.173}Eu_{0.2}Mn_{0.04}SiO_4$ | 0.455 | 0.291 | 630 | 96 | 0.56 | 74 | 0.04 | 0.67 | 0.00 |

Example B-3

$BaCO_3$, $CaCO_3$, $MgCO_3$, $Eu_2O_3$, $MnCO_3 \cdot nH_2O$ and $SiO_2$ were weighed to a molar ratio of 1.283:0.428:0.09:0.075: 0.05:1, and $NH_4Cl$ was added as a flux, followed by mixing in a ball mill for 1 hour. This prepared powder was put in an alumina crucible, further put together with this crucible in a crucible made of carbon, and heated under a stream of nitrogen gas containing 4% of hydrogen at 1200° C. for 6

1.215:0.405:0.180:0.075:0.05:1. The results of X-ray diffraction measurement are shown in Table 7, and this example meets the conditions of claim 6. An emission spectrum is shown in FIG. 11, and characteristics are summarized in Table 8.

Example B-5

A phosphor $Ba_{0.855}Ca_{0.285}Sr_{0.57}Mg_{0.09}Eu_{0.15}Mn_{0.05}SiO_4$ was obtained in the same manner as in Example B-3 with the exception that $BaCO_3$, $CaCO_3$, $SrCO_3$, $MgCO_3$, $Eu_2O_3$, $MnCO_3 \cdot nH_2O$ and $SiO_2$ were weighed to a molar ratio of 0.855:0.285:0.57:0.09:0.075:0.05:1. The results of X-ray diffraction measurement are shown in Table 7, and this example meets the conditions of claim 6. An emission spectrum is shown in FIG. 11, and characteristics are summarized in Table 8.

Example B-6

A phosphor $Ba_{0.81}Ca_{0.27}Sr_{0.54}Mg_{0.18}Eu_{0.15}Mn_{0.05}SiO_4$ was obtained in the same manner as in Example B-3 with the exception that $BaCO_3$, $CaCO_3$, $SrCO_3$, $MgCO_3$, $Eu_2O_3$, $MnCO_3 \cdot nH_2O$ and $SiO_2$ were weighed to a molar ratio of 0.810:0.27:0.54:0.18:0.075:0.05:1. The results of X-ray diffraction measurement are shown in Table 7, and this example does not meet the conditions of claim 6. An emission spectrum is shown in FIG. 11, and characteristics are summarized in Table 8.

TABLE 7

| Reference Diffraction Peak Angle | Angle Range | Start Angle | End Angle | Measured Angle | Measured Relative Intensity |
|---|---|---|---|---|---|
| Example B-3 | | | | | |
| 21.512 | R1 | 29.741 | 30.356 | 30.222 | 88.0 |
| Intensity | R2 | 30.701 | 31.337 | 31.108 | 100.0 |
| 67.5 | R3 | 36.375 | 37.136 | 36.723 | 17.0 |
| | R4 | 37.694 | 38.485 | 38.207 | 35.9 |
| | R5 | 43.377 | 44.299 | 44.006 | 43.6 |
| Example B-4 | | | | | |
| 21.761 | R1 | 30.089 | 30.712 | 30.523 | 94.0 |
| Intensity | R2 | 31.061 | 31.705 | 31.396 | 100.0 |
| 70.1 | R3 | 36.806 | 37.577 | 37.049 | 18.7 |
| | R4 | 38.141 | 38.943 | 38.528 | 32.4 |
| | R5 | 43.898 | 44.833 | 44.346 | 41.1 |
| Example B-5 | | | | | |
| 21.834 | R1 | 30.191 | 30.816 | 30.641 | 72.8 |
| Intensity | R2 | 31.167 | 31.813 | 31.572 | 100.0 |
| 27.5 | R3 | 36.932 | 37.706 | 37.508 | 23.0 |
| | R4 | 38.273 | 39.077 | 38.618 | 24.9 |
| | R5 | 44.052 | 44.990 | 44.479 | 22.2 |
| Example B-6 | | | | | |
| 21.764 | R1 | 30.094 | 30.716 | 30.568 | 56.3 |
| Intensity | R2 | 31.066 | 31.710 | 31.500 | 100.0 |
| 19.2 | R3 | 36.811 | 37.582 | 37.433 | 16.2 |
| | R4 | 38.147 | 38.948 | 38.544 | 19.1 |
| | R5 | 43.905 | 44.839 | 44.405 | 15.8 |

Example C-1

An aqueous solution of $Ba(NO_3)_2$, an aqueous solution of $Mg(NO_3)_2 \cdot 6H_2O$, an aqueous solution of $Eu(NO_3)_3 \cdot 6H_2O$, an aqueous solution of $Mn(NO_3)_2 \cdot 6H_2O$ and a suspension of colloidal silica ($SiO_2$) (the molar ratio of $Ba(NO_3)_2$, $Mg(NO_3)_2 \cdot 6H_2O$, $Eu(NO_3)_3 \cdot 6H_2O$, $Mn(NO_3)_2 \cdot 6H_2O$ and $SiO_2$ is 0.935:0.935:0.1:0.03:1) were mixed in a platinum container and dried. Then, the mixture was burnt by heating under a stream of nitrogen gas containing 4% of hydrogen at 1050° C. for 2 hours to produce a phosphor $Ba_{0.935}Mg_{0.935}Eu_{0.1}Mn_{0.03}SiO_4$ (phosphor used in a second light emitter). An emission spectrum at the time when this phosphor was excited at 400 nm, a main wavelength in an ultraviolet light region of a GaN-based light emitting diode, was measured. The wavelength of an emission peak thereof, the intensity of the emission peak at the time when the intensity of an emission peak of Comparative Example C-5 described later is taken as 100 (hereinafter referred to as the relative intensity), and the half-value width are shown in Table 9. This reveals that this phosphor emits strong red light giving high color rendering properties because of its sufficiently high intensity and wide half-value width, and that it emits bright deep red light, because the wavelength of emission peak is in the region of 615 nm to 645 nm. According to measurement of an excitation spectrum at a peak wavelength of 630 nm, relative intensities at excitation wavelengths of 254 nm, 280 nm, 382 nm and 400 nm are 208, 328, 351 and 320, respectively, and light emission by excitation at around 400 nm is strong 1.5 times or more the conventional light emission by excitation at 254 nm. This shows that this phosphor is a phosphor which is very advantageous to a light source of a GaN-based semiconductor.

Comparative Example C-1

A phosphor $Ba_{0.95}Mg_{0.95}Eu_{0.1}SiO_4$ was produced in the same manner as in Example C-1 with the exception that an aqueous solution of $Ba(NO_3)_2$, an aqueous solution of $Mg(NO_3)_2 \cdot 6H_2O$, an aqueous solution of $Eu(NO_3)_3 \cdot 6H_2O$ and a suspension of colloidal silica ($SiO_2$) (the molar ratio of $Ba(NO_3)_2$, $Mg(NO_3)_2 \cdot 6H_2O$, $Eu(NO_3)_3 \cdot 6H_2O$ and $SiO_2$ is 0.95:0,95:0.1:1) were used as original solutions. An emission spectrum at the time when this phosphor was excited at 400 nm, a main wavelength in an ultraviolet light region of a GaN-based light emitting diode, was measured. The wavelength, relative intensity and half-value width of an emission peak thereof are shown in Table 9. This shows that when Mn is not added in the composition of Example C-1, no red peak appears.

TABLE 8

| Example | Chemical Composition of Phosphor | Chromaticity Coordinates x | Chromaticity Coordinates y | Wavelength of Emission Peak (nm) | Intensity of Emission Peak (arbitrary scale) |
|---|---|---|---|---|---|
| Example B-3 | $Ba_{1.283}Ca_{0.428}Mg_{0.09}Eu_{0.15}Mn_{0.05}SiO_4$ | 0.510 | 0.373 | 612 | 439 |
| Example B-4 | $Ba_{1.215}Ca_{0.405}Mg_{0.18}Eu_{0.15}Mn_{0.06}SiO_4$ | 0.491 | 0.364 | 622 | 404 |
| Example B-5 | $Ba_{0.855}Ca_{0.285}Sr_{0.57}Mg_{0.09}Eu_{0.15}Mn_{0.05}SiO_4$ | 0.528 | 0.429 | 623 | 143 |
| Example B-6 | $Ba_{0.81}Ca_{0.27}Sr_{0.54}Mg_{0.18}Eu_{0.15}Mn_{0.05}SiO_4$ | 0.499 | 0.421 | 629 | 100 |

Example C-2

A phosphor $Ba_{0.623}Mg_{1.247}Eu_{0.1}Mn_{0.03}SiO_4$ was produced in the same manner as in Example C-1 with the exception that an aqueous solution of $Ea(NO_3)_2$, an aqueous solution of $Mg(NO_3)_2.6H_2O$, an aqueous solution of $Eu(NO_3)_3.6H_2O$, an aqueous solution of $Mn(NO_3)_2.6H_2O$ and a suspension of colloidal silica ($SiO_2$) (the molar ratio of $Ba(NO_3)_2$, $Mg(NO_3)_2.6H_2O$, $Eu(NO_3)_3.6H_2O$, $Mn(NO_3)_2.6H_2O$ and $SiO_2$ is 0.623:1.247:0.1:0.03:1) were used as original solutions. An emission spectrum at the time when this phosphor was excited at 400 nm, a main wavelength in an ultraviolet light region of a GaN-based light emitting diode, was measured. The wavelength, relative intensity and half-value width of an emission peak thereof are shown in Table 9. This reveals that this phosphor emits strong red light giving high color rendering properties because of its sufficiently high intensity and wide half-value width, and that it emits bright deep red light, because the wavelength of emission peak is in the region of 615 nm to 645 nm.

Comparative Example C-2

A phosphor $Ba_{0.633}Mg_{1.267}Eu_{0.1}SiO_4$ was produced in the same manner as in Example C-1 with the exception that an aqueous solution of $Ba(NO_3)_2$, an aqueous solution of $Mg(NO_3)_2.6H_2O$, an aqueous solution of $Eu(NO_3)_3.6H_2O$ and a suspension of colloidal silica ($SiO_2$) (the molar ratio of $Ba(NO_3)_2$, $Mg(NO_3)_2.6H_2O$, $Eu(NO_3)_3.6H_2O$ and $SiO_2$ is 0.633:1.267:0.1:1) were used as original solutions. An emission spectrum at the time when this phosphor was excited at 400 nm, a main wavelength in an ultraviolet light region of a GaN-based light emitting diode, was measured. The wavelength, relative intensity and half-value width of an emission peak thereof are shown in Table 9. This shows that when Mn is not added in the composition of Example C-2, no red peak appears.

Example C-3

Figure 12:
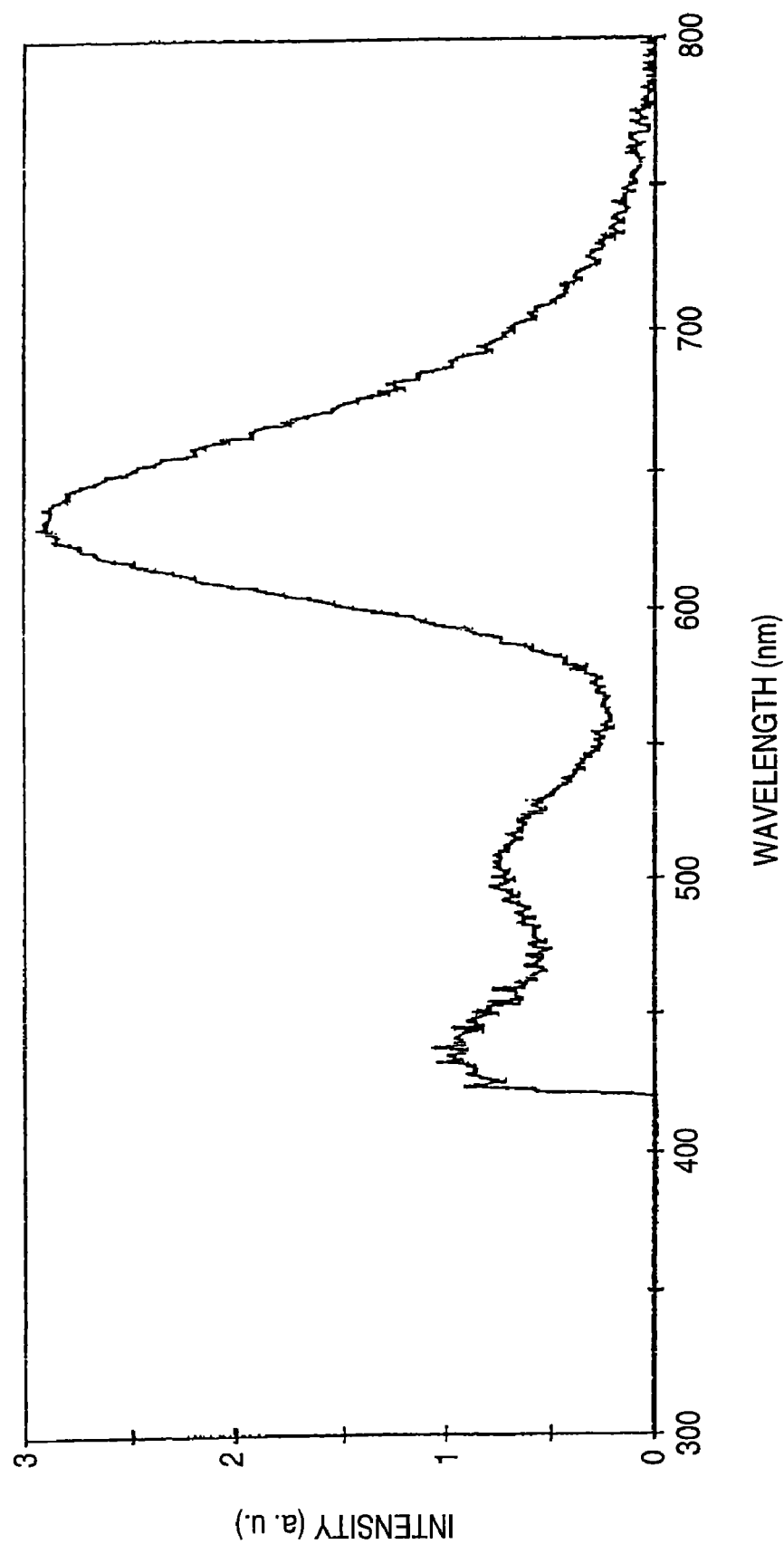
FIG. 12 is an emission spectrum of a phosphor of Example C-3 at the time when it has irradiated with light of 400 nm which is a main wavelength in an ultraviolet light region of a GaN-based light emitting diode.

A phosphor $Ba_{0.587}Mg_{1.173}Eu_{0.2}Mn_{0.04}SiO_4$ was produced in the same manner as in Example C-1 with the exception that an aqueous solution of $Ba(NO_3)_2$, an aqueous solution of $Mg(NO_3)_2.6H_2O$, an aqueous solution of $Eu(NO_3)_3.6H_2O$, an aqueous solution of $Mn(NO_3)_2.6H_2O$ and a suspension of colloidal silica ($SiO_2$) (the molar ratio of $Ba(NO_3)_2$, $Mg(NO_3)_2.6H_2O$, $Eu(NO_3)_3.6H_2O$, $Mn(NO_3)_2.6H_2O$ and $SiO_2$ is 0.587:1.173:0.2:0.04:1) were used as original solutions. An emission spectrum at the time when this phosphor was excited at 400 nm, a main wavelength in an ultraviolet light region of a GaN-based light emitting diode, was measured. An emission spectrum thereof is shown in FIG. 12. In order to remove the influence of an excitation light source on the emission spectrum, the measurement was made introducing a filter for cutting light of 420 nm or less. The wavelength, relative intensity and half-value width of an emission peak thereof are shown in Table 9. This reveals that this phosphor emits strong red light giving high color rendering properties because of its sufficiently high intensity and wide half-value width, and that it emits bright deep red light, because the wavelength is in the region of 615 nm to 645 nm.

Comparative Example C-3

A phosphor $Ba_{0.6}Mg_{1.2}Eu_{0.2}SiO_4$ was produced in the same manner as in Example C-1 with the exception that an aqueous solution of $Ba(NO_3)_2$, an aqueous solution of $Mg(NO_3)_2.6H_2O$, an aqueous solution of $Eu(NO_3)_3.6H_2O$ and a suspension of colloidal silica ($SiO_2$) (the molar ratio of $Ba(NO_3)_2$, $Mg(NO_3)_2.6H_2O$, $Eu(NO_3)_3.6H_2O$ and $SiO_2$ is 0.6:1.2:0.2:1) were used as original solutions. An emission spectrum at the time when this phosphor was excited at 400 nm, a main wavelength in an ultraviolet light region of a GaN-based light emitting diode, was measured. The wavelength, relative intensity and half-value width of an emission peak thereof are shown in Table 9. This shows that when Mn is not added in the composition of Example C-3, no red peak appears.

Comparative Example C-4

A phosphor $Ba_{1.7}Eu_{0.2}Mn_{0.1}SiO_4$ was produced in the same manner as in Example C-1 with the exception that an aqueous solution of $Ba(NO_3)_2$, an aqueous solution of $Eu(NO_3)_3.6H_2O$, an aqueous solution of $Mn(NO_3)_2.6H_2O$ and a suspension of colloidal silica ($SiO_2$) (the molar ratio of $Ba(NO_3)_2$, $Eu(NO_3)_3.6H_2O$, $Mn(NO_3)_2$ and $SiO_2$ is 1.7:0.2:0.1:1) were used as original solutions. An emission spectrum at the time when this phosphor was excited at 400 nm, a main wavelength in an ultraviolet light region of a GaN-based light emitting diode, was measured. The wavelength, relative intensity and half-value width of an emission peak thereof are shown in Table 9. This shows that even though Mn is contained in crystals, when Mg is not contained, no red peak appears.

Comparative Example C-5

A phosphor $Ba_{0.567}Ca_{0.567}Mg_{0.566}Eu_{0.2}Mn_{0.1}SiO_4$ was produced in the same manner as in Example C-1 with the exception that an aqueous solution of $Ba(NO_3)_2$, an aqueous solution of $Ca(NO_3)_2.4H_2O$, an aqueous solution of $Mg(NO_3)_2.6H_2O$, an aqueous solution of $Eu(NO_3)_3.6H_2O$, an aqueous solution of $Mn(NO_3)_2.6H_2O$ and a suspension of colloidal silica ($SiO_2$) (the molar ratio of $Ba(NO_3)_2$, $Ca(NO_3)_2$, $Mg(NO_3)_2.6H_2O$, $Eu(NO_3)_3.6H_2O$, $Mn(NO_3)_2.6H_2O$ and $SiO_2$ is 0.567:0.567:0.566:0.2:0.1:1) were used as original solutions. An emission spectrum at the time when this phosphor w a s excited at 400 nm, a main wavelength in an ultraviolet light region of a GaN-based light emitting diode, was measured. The wavelength, relative intensity and half-value width of an emission peak thereof are shown in Table 9. This shows that when the existing amount of Ca is too much to Ba, the wavelength of emission peak becomes less than 615 nm to cause failure to emit bright deep red light.

TABLE 9

| Example or Comparative Example | Chemical Composition of Phosphor | Wavelength of Emission Peak (nm) | Relative Intensity of Emission Peak | Half-Value Width of Emission Peak (nm) | Molar Ratio of Eu | Molar Ratio of Mn | Ratio of Mg to the Sum of Divalent Element Except Eu and Mn, Monovalent, Trivalent and Pentavalent Elements (molar ratio) | Ratio of Ca to the Sum of Ba and Ca (molar ratio) |
|---|---|---|---|---|---|---|---|---|
| Example C-1 | $Ba_{0.935}Mg_{0.935}Eu_{0.1}Mn_{0.03}SiO_4$ | 630 | 320 | 74 | 0.1 | 0.03 | 0.5 | 0 |
| Example C-2 | $Ba_{0.623}Mg_{1.247}Eu_{0.1}Mn_{0.03}SiO_4$ | 633 | 191 | 73 | 0.1 | 0.03 | 0.67 | 0 |
| Example C-3 | $Ba_{0.687}Mg_{1.173}Eu_{0.2}Mn_{0.04}SiO_4$ | 630 | 127 | 74 | 0.2 | 0.04 | 0.67 | 0 |
| Comparative Example C-1 | $Ba_{0.85}Mg_{0.96}Eu_{0.1}SiO_4$ | 442 | 246 | 117 | 0.1 | 0 | 0.5 | 0 |
| Comparative Example C-2 | $Ba_{0.633}Mg_{1.267}Eu_{0.1}SiO_4$ | 443 | 162 | 97 | 0.1 | 0 | 0.67 | 0 |
| Comparative Example C-3 | $Ba_{0.6}Mg_{1.2}Eu_{0.2}SiO_4$ | 438 | 323 | 42 | 0.2 | 0 | 0.67 | 0 |
| Comparative Example C-4 | $Ba_{1.7}Eu_{0.2}Mn_{0.1}SiO_4$ | 504 | 122 | 63 | 0.2 | 0.1 | 0 | |
| Comparative Example C-5 | $Ba_{0.567}Ca_{0.567}Mg_{0.566}Eu_{0.2}Mn_{0.1}SiO_4$ | 602 | 100 | 95 | 0.2 | 0.1 | 0.33 | 0.5 |

Example C-4

Figure 13:
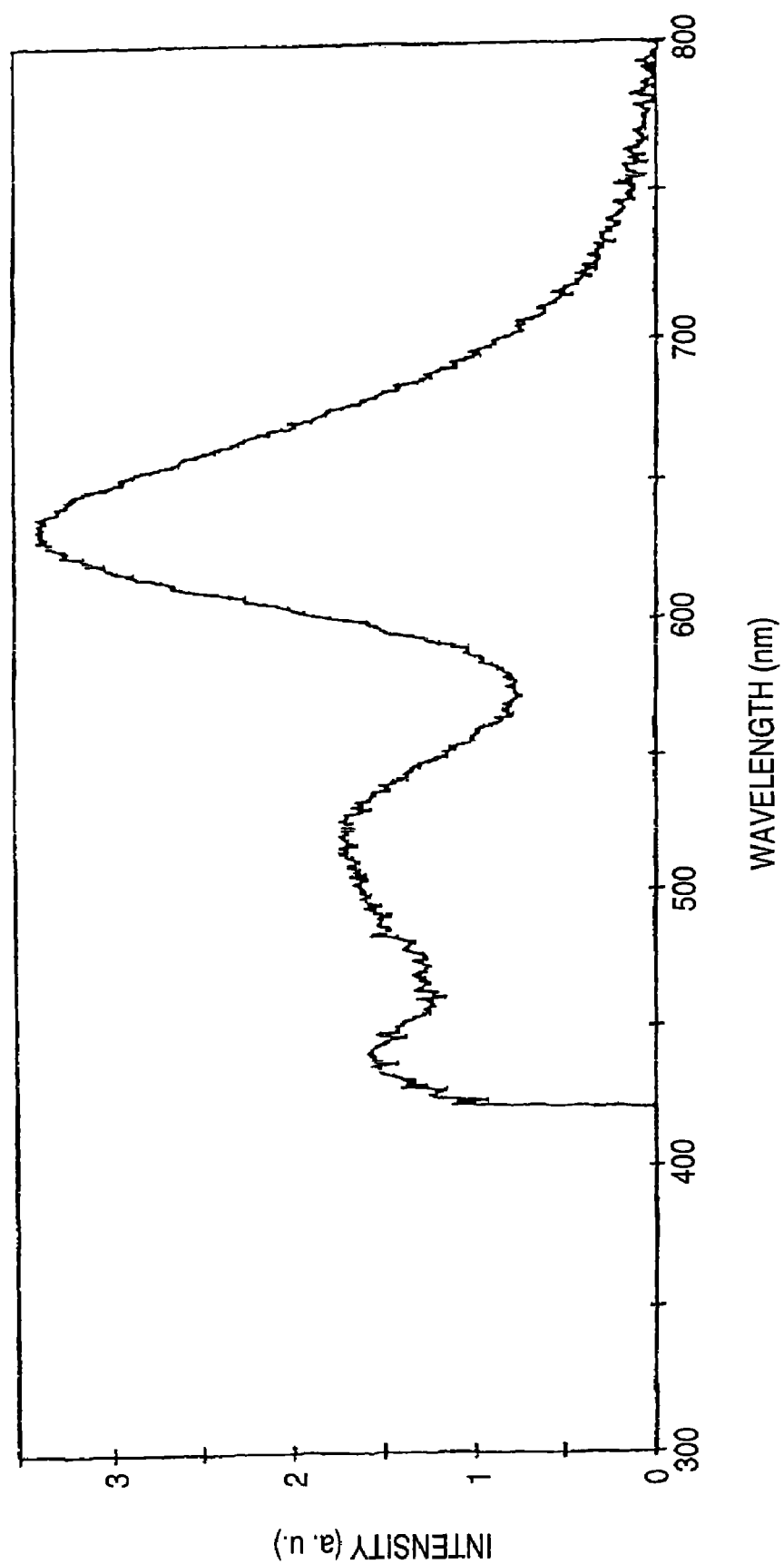
FIG. 13 is an emission spectrum of a phosphor of Example C-4 at the time when it has irradiated with light of 400 nm which is a main wavelength in an ultraviolet light region of a GaN-based light emitting diode.

A phosphor $Ba_{0.92}Mg_{0.92}Eu_{0.1}Mn_{0.06}SiO_4$ was produced in the same manner as in Example C-1 with the exception that an aqueous solution of $Ba(NO_3)_2$, an aqueous solution of $Mg(NO_3)_2.6H_2O$, an aqueous solution of $Eu(NO_3)_3.6H_2O$, an aqueous solution of $Mn(NO_3)_2.6H_2O$ and a suspension of colloidal silica $(SiO_2)$ (the molar ratio of $Ba(NO_3)_2$, $Mg(NO_3)_2.6H_2O$, $Eu(NO_3)_3.6H_2O$, $Mn(NO_3)_2.6H_2O$ and $SiO_2$ is 0.92:0.92:0.1:0.06;1) were used as original solutions. An emission spectrum at the time when this phosphor was excited at 400 nm, a main wavelength in an ultraviolet light region of a GaN-based light emitting diode, was measured. An emission spectrum thereof is shown in FIG. 13. The wavelength and relative intensity of a peak of 590 nm or more (a peak of a red component), the wavelength and relative intensity of the maximum peak of less than 590 nm, the half-value width of a group of peaks and the x and y values of chromaticity coordinates indicating colors are shown in Table 10. This shows that a wide spectrum containing a deep red component in which the peak wavelength is in the region of 615 nm to 645 nm and also containing blue and green components is obtained to give high color rendering properties, resulting in bright white light emission.

The maximum peak of less than 590 nm means a peak which is highest in intensity when a plurality of peaks exist in the region of less than 590 nm in an emission spectrum, and in the case of a single peak, the maximum peak means itself. Further, the half-value width of a group of peaks gives an indication of how wide an emission spectrum distributes, and how high color rendering properties are, and is defined as the total of widths of wavelength regions having an intensity of half or more the intensity of the maximum peak in the spectrum, as shown in FIG. 6.

Comparative Example C-6

A phosphor $Ba_{0.95}Mg_{0.95}Eu_{0.1}SiO_4$ emitting white light was produced in the same manner as in Example C-1 with the exception that an aqueous solution of $Ba(NO_3)_2$, an aqueous solution of $Mg(NO_3)_2.6H_2O$, an aqueous solution of $Eu(NO_3)_3.6H_2O$ and a suspension of colloidal silica $(SiO_2)$ (the molar ratio of $Ba(NO_3)_2$, $Mg(NO_3)_2.6H_2O$, $Eu(NO_3)_3.6H_2O$ and $SiO_2$ is 0.95:0.95:0.1:1) were used as original solutions. An emission spectrum at the time when this phosphor was excited at 400 nm, a main wavelength in an ultraviolet light region of a GaN-based light emitting diode, was measured. The wavelength and relative intensity of a peak of a red component, the wavelength and relative intensity of the maximum peak of less than 590 nm, the half-value width of a group of peaks and the x and y values of chromaticity coordinates are shown in Table 10. This shows that when Mn is not added in the composition of Example C-4, no red peak appears.

Comparative Example C-7

A phosphor $Ba_{1.2}Ca_{0.2}Mg_{0.4}Eu_{0.2}SiO_4$ was produced in the same manner as in Example C-1 with the exception that an aqueous solution of $Ba(NO_3)_2$, an aqueous solution of $Ca(NO_3)_2.4H_2O$, an aqueous solution of $Mg(NO_3)_2.6H_2O$, an aqueous solution of $Eu(NO_3)_3.6H_2O$ and a suspension of colloidal silica $(SiO_2)$ (the molar ratio of $Ea(NO_3)_2$, $Ca(NO_3)_2.4H_2O$, $Mg(NO_3)_2.6H_2O$, $Eu(NO_3)_3.6H_2O$ and $SiO_2$ is 1.2:0.2:0.4:0.2:1) were used as original solutions. An emission spectrum at the time when this phosphor was excited at 400 nm, a main wavelength in an ultraviolet light region of a GaN-based light emitting diode, was measured. The wavelength and relative intensity of a peak of a red component, the wavelength and relative intensity of the maximum peak of less than 590 nm, the half-value width of a group of peaks and the x and y values of chromaticity coordinates are shown in Table 10. This shows that when Mn is not added in the composition of Example C-5, no red peak appears.

Example C-5

A phosphor $Ba_{0.82}Mg_{0.82}Eu_{0.3}Mn_{0.06}SiO_4$ was produced in the same manner as in Example C-1 with the exception that an aqueous solution of $Ba(NO_3)_2$, an aqueous solution of $Mg(NO_3)_2.6H_2O$, an aqueous solution of $Eu(NO_3)_3.6H_2O$, an aqueous solution of $Mn(NO_3)_2.6H_2O$ and a suspension of colloidal silica $(SiO_2)$ (the molar ratio of $Ba(NO_3)_2$, $Mg(NO_3)_2.6H_2O$, $Eu(NO_3)_3.6H_2O$, $M(NO_3)_2.6H_2O$ and $SiO_2$ is 0.82:0.82:0.3:0.06:1) were used as original solutions. An emission spectrum at the time when this phosphor was excited at 400 nm, a main wavelength in an ultraviolet light region of a GaN-based light emitting diode, was measured.

The wavelength and relative intensity of a peak of a red component, the wavelength and relative intensity of the maximum peak of less than 590 nm, the half-value width of a group of peaks and the x and y values of chromaticity coordinates are shown in Table 10. This shows that a wide spectrum containing a deep red component in which the peak wavelength is in the region of 615 nm to 645 nm and also containing blue and green components is obtained to give high color rendering properties, resulting in bright white light emission.

Comparative Example C-8

A phosphor $Ba_{0.85}Mg_{0.85}Eu_{0.3}SiO_4$ was produced in the same manner as in Example C-1 with the exception that an aqueous solution of $Ba(NO_3)_2$, an aqueous solution of $Mg(NO_3)_2.6H_2O$, an aqueous solution of $Eu(NO_3)_3.6H_2O$ and a suspension of colloidal silica ($SiO_2$) (the molar ratio of $Ba(NO_3)_2$, $Mg(NO_3)_2.6H_2O$, $Eu(NO_3)_3.6H_2O$ and $SiO_2$ is 0.85:0.85:0.3:1) were used as original solutions. An emission spectrum at the time when this phosphor was excited at 400 nm, a main wavelength in an ultraviolet light region of a GaN-based light emitting diode, was measured. The wavelength and relative intensity of a peak of a red component, the wavelength and relative intensity of the maximum peak of less than 590 nm, the half-value width of a group of peaks and the x and y values of chromaticity coordinates are shown in Table 10. This shows that when Mn is not added in the composition of Example C-6, no red peak appears.

Comparative Example C-9

A phosphor $Ba_{0.88}Ca_{0.44}Mg_{0.44}Eu_{0.2}Mn_{0.04}SiO_4$ was produced in the same manner as in Example C-1 with the exception that an aqueous solution of $Ba(NO_3)_2$, an aqueous solution of $Ca(NO_3)_2.4H_2O$, an aqueous solution of $Mg(NO_3)_2.6H_2O$, an aqueous solution of $Eu(NO_3)_3.6H_2O$, an aqueous solution of $Mn(NO_3)_2.6H_2O$ and a suspension of colloidal silica ($SiO_2$) (the molar ratio of $Ba(NO_3)_2$, $Ca(NO_3)_2$, $Mg(NO_3)_2.6H_2O$, $Eu(NO_3)_3.6H_2O$, $Mn(NO_3)_2.6H_2O$ and $SiO_2$ is 0.88:0.44:0.44:0.2:0.04:1) were used as original solutions. An emission spectrum at the time when this phosphor was excited at 400 nm, a main wavelength in an ultraviolet light region of a GaN-based light emitting diode, was measured. The wavelength and relative intensity of a peak of a red component, the wavelength and relative intensity of the maximum peak of less than 590 nm, the half-value width of a group of peaks and the x and y values of chromaticity coordinates are shown in Table 10. This shows that when Ca exists in an amount as much as half of Ba in crystals, the peak wavelength of a red component becomes less than 615 nm to cause failure to emit bright white light.

Comparative Example C-10

A phosphor $Ba_{1.144}Ca_{0.216}Mg_{0.48}Eu_{0.01}Mn_{0.15}SiO_4$ produced in the same manner as in Example C-1 with the exception that an aqueous solution of $Ea(NO_3)_2$, an aqueous solution of $Ca(NO_3)_2.4H_2O$ an aqueous solution of $Mg(NO_3)_2.6H_2O$ an aqueous solution of $Eu(NO_3)_3.6H_2O$, an aqueous solution of $Mn(NO_3)_2.6H_2O$ and a suspension of colloidal silica ($SiO_2$) (the molar ratio of $Ea(NO_3)_2$, $Ca(NO_3)_2$, $Mg(NO_3)_2.6H_2O$, $Eu(NO_3)_3.6H_2O$, $Mn(NO_3)_2.6H_2O$ and $SiO_2$ is 1.144:0.216:0.48:0.01:0.15:1) were used as original solutions. An emission spectrum at the time when this phosphor was excited at 400 nm, a main wavelength in an ultraviolet light region of a GaN-based light emitting diode, was measured. The wavelength and relative intensity of a peak of a red component, the wavelength and relative intensity of the maximum peak of less than 590 nm, the half-value width of a group of peaks and the x and y values of chromaticity coordinates are shown in Table 10. This shows that when the molar ratio of Eu is as small as 0.01, the intensity of a red component becomes somewhat small.

TABLE 10

| Example or Comparative Example | Chemical Composition of Phosphor | Peak of 590 nm or More (Peak of Red Component) | | Maximum Peak of Less Than 590 nm | |
|---|---|---|---|---|---|
| | | Wavelength (nm) | Relative Intensity | Wavelength (nm) | Relative Intensity |
| Example C-4 | $Ba_{0.92}Mg_{0.92}Eu_{0.1}Mn_{0.06}SiO_4$ | 629 | 147 | 521 | 76 |
| Example C-5 | $Ba_{0.82}Mg_{0.82}Eu_{0.3}Mn_{0.06}SiO_4$ | 637 | 108 | 507 | 72 |
| Comparative Example C-6 | $Ba_{0.95}Mg_{0.95}Eu_{0.1}SiO_4$ | — | 0 | 442 | 246 |
| Comparative Example C-7 | $Ba_{1.2}Ca_{0.2}Mg_{0.4}Eu_{0.2}SiO_4$ | — | 0 | 509 | 465 |
| Comparative Example C-8 | $Ba_{0.85}Mg_{0.85}Eu_{0.3}SiO_4$ | — | 0 | 507 | 227 |
| Comparative Example C-9 | $Ba_{0.88}Ca_{0.44}Mg_{0.44}Eu_{0.2}Mn_{0.04}SiO_4$ | 600 | 128 | 470 | 100 |
| Comparative Example C-10 | $Ba_{1.144}Ca_{0.216}Mg_{0.48}Eu_{0.01}Mn_{0.15}SiO_4$ | 637 | 41 | 429 | 68 |

TABLE 10-continued

| Example or Comparative Example | Half-Value Width of Group of Peaks (nm) | Chromaticity Coordinates | | Molar Ratio of Eu | Molar Ratio of Mn | Ratio of Mg to the Sum of Divalent Element Except Eu and Mn, Monovalent, Trivalent and Pentavalent Elements (molar ratio) | Ratio of Ca to the Sum of Ba and Ca (molar ratio) |
|---|---|---|---|---|---|---|---|
| | | x | y | | | | |
| Example C-4 | 101 | 0.384 | 0.33 | 0.1 | 0.06 | 0.5 | 0 |
| Example C-5 | 124 | 0.373 | 0.329 | 0.3 | 0.06 | 0.5 | 0 |
| Comparative Example C-6 | 119 | 0.167 | 0.267 | 0.1 | 0 | 0.5 | 0 |
| Comparative Example C-7 | 73 | 0.199 | 0.476 | 0.2 | 0 | 0.22 | 0.14 |
| Comparative Example C-8 | 118 | 0.180 | 0.284 | 0.3 | 0 | 0.5 | 0 |
| Comparative Example C-9 | 172 | 0.356 | 0.333 | 0.2 | 0.04 | 0.25 | 0.33 |
| Comparative Example C-10 | 101 | 0.316 | 0.177 | 0.01 | 0.15 | 0.26 | 0.16 |

Although the present invention has been described in detail using particular embodiments, it will be obvious to those skilled in the art that various changes and variations are possible without departing from the spirit and scope of the invention.

The present application is based on Japanese Patent Application (Patent Application No. 2004-9768) filed on Jan. 16, 2004, Patent Application (Patent Application No. 2004-9769) filed on Jan. 16, 2004, and Patent Application (Patent Application No. 2004-9770) filed on Jan. 16, 2004, the whole of which is incorporated herein by reference.

INDUSTRIAL APPLICABILITY

According to the present invention, there can be provided a high-efficiency red light emitting phosphor and white light emitting phosphor for using in a display or lighting which high-efficiently emits light in combination with a light source which emits light in the region from near-ultraviolet light to visible light.

The invention claimed is:

1. A phosphor comprising a crystal phase having any one chemical composition of the following formulas [1] to [3]:

$$Eu_{a0}Mn_{b0}M^{10}{}_{c0}M^{20}{}_{d0}M^{30}O_{e0}Z^{0}{}_{f0} \quad [1]$$

wherein $M^{10}$ is a divalent element containing 85 mol % or more of at least one element selected from the group consisting of Ba, Ca and Sr, in which the ratio (molar ratio) of Ca to the sum of Ba and Ca is from 0.1 to 0.9; $M^{20}$ represents at least one element selected from the group consisting of a monovalent, trivalent and pentavalent elements; $M^{30}$ represents a group of tetravalent elements containing Si and Ge in a total amount of 90 mol % or more; $Z^{0}$ is at least one element selected from the group consisting of a minus monovalent and minus divalent elements, H and N; and a0 is a number satisfying 0.001a0≦0.6, b0 is a number satisfying 0≦b0≦0.7, c0 and d0 are numbers satisfying 0≦d0/(c0+d0)0.2, a0, b0 c0 and d0 are numbers satisfying 1.8≦(a0+b0+c0+d0)≦2.2, and e0 and f0 are numbers satisfying 0≦f0/(e0+f0)≦0.035 and 3.6≦(e0+f0)≦4.4:

$$Eu_{a1}Mn_{b1}Mg_{c1}M^{11}{}_{d1}M^{21}O_{e1}Z^{1}{}_{f1} \quad [2]$$

wherein $M^{11}$ represents at least one element selected from the group consisting of a monovalent element, a divalent element except Eu, Mn and Mg, a trivalent element and a pentavalent element, in which the proportion of the divalent element is 80 mol % or more, the proportion of the sum of Ba, Ca and Sr is 40mol % or more, and the ratio (molar ratio) of Ca to the sum of Ba and Ca is from 0.2 to 0.9; $M^{21}$ represents a group of tetravalent elements containing Si and Ge in a total amount of 90 mol % or more; $Z^{1}$ is at least one element selected from the group consisting of a minus monovalent and minus divalent elements, H and N; and a1 is a number satisfying 0.001≦a1≦0.8, b1 is a number satisfying 0<b1≦0.8, c1 and d1 are numbers satisfying 0<c1/(c1+d1)≦0.2, a1 b1 c1 and d1 are numbers satisfying 1.8≦(a1+b1+c1+d1) ≦2.2, and e1 and f1 are numbers satisfying 0≦f1/(e1+f1)≦0.035 and 3.6≦(e1+f1)≦4.4:

$$Eu_{a2}Mn_{b2}Mg_{c2}M^{12}{}_{d2}M^{22}O_{e2}Z^{2}{}_{f2} \quad [3]$$

wherein $M^{12}$ represents at least one element selected from the group consisting of a monovalent element, a divalent element except Eu, Mn and Mg, a trivalent element and a pentavalent element, in which the proportion of the divalent element is 80 mol % or more, the proportion of the sum of Ba, Ca and Sr is 40mol % or more, and the ratio (molar ratio) of Ca to the sum of Ba and Ca is less than 0.2; $M^{22}$ represents a group of tetravalent elements containing Si and Ge in a total amount of 90 mol % or more; $Z^{2}$ is at least one element selected from the group consisting of a minus monovalent and minus divalent elements, H and N; and a2 is a number satisfying 0.0003≦a2≦0.8, b2 is a number satisfying 0<b2≦0.8, c2 and d2 are numbers satisfying 0<c2/(c2+d2)≦0.2 or 0.3≦c2/(c2+d2)≦0.8, a2, b2 c2 and d2 are numbers satisfying 1.8≦(a2+b2+c2+d2)≦2.2, and e2 and f2 are numbers satisfying 0≦f2/(e2+f2)≦0.035 and 3.6≦(e2+f2)≦4.4, wherein the phosphor emits red or white light.

2. The phosphor according to claim 1 comprising a crystal phase having a chemical composition of said formula [1], wherein $M^{10}$ is a divalent element containing 85 mol % or more of at least one element selected from the group consisting of Ba, Ca and Sr, in which the ratio (molar ratio) of Ca to the sum of Ba and Ca is from 0.2 to 0.8; $M^{20}$ represents at least one element selected from the group consisting of a monovalent, trivalent and pentavalent elements; $M^{30}$ is Si; $Z^0$ is at least one element selected from the group consisting of a minus monovalent and minus divalent elements, H and N; and a0 is a number satisfying $0.02<a0\leq0.5$, b0 is a number satisfying $0<b0\leq0.7$, c0 and d0 are numbers satisfying $0\leq d0/(c0+d0)\leq0.1$, a0, b0 c0 and d0 are numbers satisfying $1.8\leq(a0+b0+c0+d0)\leq2.2$, and e0 and f0 are numbers satisfying $0\leq f0/(e0+f0)\leq0.01$ and $3.6\leq(e0+f0)\leq4.4$.

3. The phosphor according to claim 2, wherein $0<b0\leq0.2$ and the phosphor emits white light.

4. The phosphor according to claim 2, wherein $0.05<b0\leq0.7$ and the phosphor emits red light.

5. The phosphor according to claim 1, wherein $0<b1\leq0.15$ and the phosphor emits white light.

6. The phosphor according to 1, wherein $0.03\leq b1\leq0.8$ and the phosphor emits red light.

7. The phosphor according to claim 1 comprising a crystal phase having a chemical composition of said formula [3], wherein $M^{12}$ represents at least one element selected from the group consisting of a monovalent element, a divalent element except Eu, Mn and Mg, a trivalent element and a pentavalent element, in which the proportion of the divalent element is 80 mol % or more, the proportion of the sum of Ba, Ca and Sr is 40mol % or more, and the ratio (molar ratio) of Ca to the sum of Ba and Ca is less than 0.2; $M^{22}$ represents a group of tetravalent elements containing Si and Ge in a total amount of 90 mol % or more; $Z^2$ is at least one element selected from the group consisting of a minus monovalent and minus divalent elements, H and N; and a2 is a number satisfying $0.01<a2\leq0.5$, b2 is a number satisfying $0<b2\leq0.8$, c2 and d2 are numbers satisfying $0<c2/(c2+d2)\leq0.2$ or $0.3\leq c2/(c2+d2)\leq0.7$, a2, b2c2 and d2 are numbers satisfying $1.9\leq(a2+b2+c2+d2)\leq2.1$, and e2 and f2 are numbers satisfying $0\leq f2/(e2+f2)\leq0.01$ and $3.6\leq(e2+f2)\leq4.4$.

8. The phosphor according to claim 7, wherein $0.002<b2\leq0.6$.

9. The phosphor according to claim 7, wherein $0<c2/(c2+d2)\leq0.2$.

10. The phosphor according to claim 7, wherein $0.3\leq c2/(c2+d2)\leq0.8$.

11. The phosphor according to claim 1, wherein the phosphor comprises a specified crystal phase obtained from X-ray diffraction measurement, wherein the crystal phase satisfies the following conditions:

In X-ray diffraction measurement using a CuKα as an X-ray source, a diffraction peak is observed within the range (R0) of the diffraction angle (2θ) of from 21.30° to 22.50°, and when this diffraction peak is taken as a reference diffraction peak (P0) and 5 diffraction angle ranges derived from the Bragg angle (θs) of P0 are taken as R1, R2, R3, R4 and R5, wherein R1: $2\times\arcsin\{\sin(\theta 0)/(0.720\times1.010)\}$ to $2\times\arcsin\{\sin(\theta 0)/(0.720\times0.990)\}$, R2: $2\times\arcsin\{\sin(\theta 0)/(0.698\times1.010)\}$ to $2\times\arcsin\{\sin(\theta 0)/(0.698\times0.990)\}$, R3: $2\times\arcsin\{\sin(\theta 0)/(0.592\times1.010)\}$ to $2\times\arcsin\{\sin(\theta 0)/(0.592\times0.990)\}$, R4: $2\times\arcsin\{\sin(\theta 0)/(0.572\times1.010)\}$ to $2\times\arcsin\{\sin(\theta 0)/(0.572\times0.990)\}$, and R5: $2\times\arcsin\{\sin(\theta 0)/(0.500\times1.010)\}$ to $2\times\arcsin\{\sin(\theta 0)/(0.500\times0.990)\}$, at least one diffraction peak exists in these 5 ranges, with the proviso that P0 has an intensity of 20% or more by the diffraction peak height ratio, based on the strongest diffraction peak of said 6 or more crystal phase-derived diffraction peaks, and the other peaks has an intensity of 9% or more by the diffraction peak height ratio, wherein when two or more diffraction peaks exist in one angle range, a peak higher in intensity is selected.

12. The phosphor according to claim 1, wherein said crystal phase satisfies the following conditions:

In X-ray diffraction measurement using a CuKα as an X-ray source, a diffraction peak is observed within the range (R0) of the diffraction angle (2θ) from 21.30° to 22.50°, and when this diffraction peak is taken as a reference diffraction peak (P0) and 5 diffraction angle ranges derived from the Bragg angle (θs) of P0 are taken as R1, R2, R3, R4 and R5, wherein R1: $2\times\arcsin\{\sin(\theta 0)/(0.720\times1.010)\}$ to $2\times\arcsin\{\sin(\theta 0)/(0.720\times0.990)\}$, R2: $2\times\arcsin\{\sin(\theta 0)/(0.698\times1.010)\}$ to $2\times\arcsin\{\sin(\theta 0)/(0.698\times0.990)\}$, R3: $2\times\arcsin\{\sin(\theta 0)/(0.592\times1.010)\}$ to $2\times\arcsin\{\sin(\theta 0)/(0.592\times0.990)\}$, R4: $2\times\arcsin\{\sin(\theta 0)/(0.572\times1.010)\}$ to $2\times\arcsin\{\sin(\theta 0)/(0.572\times0.990)\}$, and R5: $2\times\arcsin\{\sin(\theta 0)/(0.500\times1.010)\}$ to $2\times\arcsin\{\sin(\theta 0)/(0.500\times0.990)\}$, at least one diffraction peak exists in these 5 ranges, with the proviso that P0 has an intensity of 20% or more by the diffraction peak height ratio, based on the strongest diffraction peak of 6 or more crystal phase-derived diffraction peaks, and the other peaks has an intensity of 9% or more by the diffraction peak height ratio, wherein when two or more diffraction peaks exist in one angle range, a peak higher in intensity is selected.

13. The phosphor according to claim 1, which emits white light.

14. The phosphor according to claim 1, which emits red light.

15. The phosphor according to claim 1, comprising a crystal phase having any one chemical composition of the following formulas [1] or [2]:

$$Eu_{a0}Mn_{b0}M^{10}{}_{c0}M^{20}{}_{d0}M^{30}O_{e0}Z^0{}_{f0} \quad [1]$$

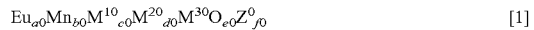

wherein $M^{10}$ is a divalent element containing 85 mol % or more of at least one element selected from the group consisting of Ba, Ca and Sr, in which the ratio (molar ratio) of Ca to the sum of Ba and Ca is from 0.1 to 0.9; $M^{20}$ represents at least one element selected from the group consisting of a monovalent, trivalent and pentavalent elements; $M^+$represents a group of tetravalent elements containing Si and Ge in a total amount of 90 mol % or more; $Z^0$ is at least one element selected from the group consisting of a minus monovalent and minus divalent elements, H and N; and a0 is a number satisfying $0.001\leq a0\leq0.6$, b0 is a number satisfying $0<b0\leq0.7$, c0 and d0 are numbers satisfying $0\leq d0/(c0+d0)\leq0.2$, a0, b0 c0 and d0 are numbers satisfying $1.8\leq(a0+b0+c0+d0)\leq2.2$, and e0 and f0 are numbers satisfying $0\leq f0/(e0+f0)\leq0.035$ and $3.6\leq(e0+f0)\leq4.4$, wherein the phosphor emits red or white light:

$$Eu_{a1}Mn_{b1}Mg_{c1}M^{11}{}_{d1}M^{21}O_{e1}Z^1{}_{f1} \quad [2]$$

wherein $M^{11}$ represents at least one element selected from the group consisting of a monovalent element, a divalent element except Eu, Mn and Mg, a trivalent element and a pentavalent element, in which the proportion of the divalent element is 80 mol % or more, the proportion of the sum of Ba, Ca and Sr is 40 mol % or more, and the ratio (molar ratio) of Ca to the sum of Ba and Ca is from 0.2 to 0.9; $M^{21}$ represents a group of tetravalent elements containing Si and Ge in a total amount of 90 mol % or more; $Z^1$ is at least one element selected from the group consisting of a minus monovalent and minus divalent elements, H and N; and a1 is a number satisfying $0.001 \leq a1 \leq 0.8$, b1 is a number satisfying $0 \leq b1 \leq 0.8$, c1 and d1 are numbers satisfying $0 < c1/(c1+d1) \leq 0.2$ a1 b1 c1 and d1 are numbers satisfying $1.8 \leq (a1+b1+c1+d1) \leq 2.2$, and e1 and f1 are numbers satisfying $0 \leq f1/(e1+f1) \leq 0.035$ and $3.6 \leq (e1+f1) \leq 4.4$, wherein the phosphor emits red or white light.

16. The phosphor according to claim 1, comprising a crystal phase having a chemical composition of the following formula [3]:

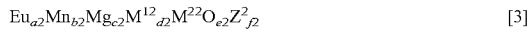

$$Eu_{a2}Mn_{b2}Mg_{c2}M^{12}{}_{d2}M^{22}{}_{e2}Z^{2}{}_{f2} \quad [3]$$

wherein $M^{12}$ represents at least one element selected from the group consisting of a monovalent element, a divalent element except Eu, Mn and Mg, a trivalent element and a pentavalent element, in which the proportion of the divalent element is 80 mol % or more, the proportion of the sum of Ba, Ca and Sr is 40 mol % or more, and the ratio (molar ratio) of Ca to the sum of Ba and Ca is less than 0.2; $M^{22}$ represents a group of tetravalent elements containing Si and Ge in a total amount of 90 mol % or more; $Z^2$ is at least one element selected from the group consisting of a minus monovalent and minus divalent elements, H and N; and a2 is a number satisfying $0.0003 \leq a2 \leq 0.8$, b2 is a number satisfying $0 < b2 \leq 0.8$, c2 and d2 are numbers satisfying $0 < c2/(c2+d2) \leq 0.2$ or $0.3 \leq c2/(c2+d2) \leq 0.8$, a2, b2 c2 and d2 are numbers satisfying $1.8 \leq (a2+b2+c2+d2) \leq 2.2$, and e2 and f2 are numbers satisfying $0 \leq f2/(e2+f2) \leq 0.035$ and $3.6 \leq (e2+f2) \leq 4.4$, wherein the phosphor emits white light.

17. A phosphor comprising a crystal phase of an alkali earth silicate containing at least one element selected from the group consisting of Ba, Sr, Ca and Mg, wherein said crystal phase is a crystal phase satisfying the following conditions:

In X-ray diffraction measurement using a CuKα as an X-ray source, a diffraction peak is observed within the range (R0) of the diffraction angle (2θ) from 21.30° to 22.50°, and when this diffraction peak is taken as a reference diffraction peak (P0) and 5 diffraction angle ranges derived from the Bragg angle (θs) of P0 are taken as R1, R2, R3, R4 and R5, wherein R1: $2 \times arc\sin\{\sin(\theta 0)/(0.720 \times 1.010)\}$ to $2 \times arc\sin\{\sin(\theta 0)/(0.720 \times 0.990)\}$, R2: $2 \times arc\sin\{\sin(\theta 0)/(0.698 \times 1.010)\}$ to $2 \times arc\sin\{\sin(\theta 0)/(0.698 \times 0.990)\}$, R3: $2 \times arc\sin\{\sin(\theta 0)/(0.592 \times 1.010)\}$ to $2 \times arc\sin\{\sin(\theta 0)/(0.592 \times 0.990)\}$, R4: $2 \times arc\sin\{\sin(\theta 0)/(0.572 \times 1.010)\}$ to $2 \times arc\sin\{\sin(\theta 0)/(0.572 \times 0.990)\}$, and R5: $2 \times arc\sin\{\sin(\theta 0)/(0.500 \times 1.010)\}$ to $2 \times arc\sin\{\sin(\theta 0)/(0.500 \times 0.990)\}$, at least one diffraction peak exists in these 5 ranges, with the proviso that P0 has an intensity of 20% or more by the diffraction peak height ratio, based on the strongest diffraction peak of said 6 or more crystal phase-derived diffraction peaks, and the other peaks has an intensity of 9% or more by the diffraction peak height ratio, wherein when two or more diffraction peaks exist in one angle range, a peak higher in intensity is selected, wherein the phosphor emits red or white light.

18. A light emitting device comprising a first light emitter which emits light of 350 nm to 430 nm and a second light emitter which emits visible light by irradiation of light from the first light emitter, wherein the second light emitter contains the phosphor according to claim 1.

19. The light emitting device according to claim 18, wherein the first light emitter is a laser diode or a light emitting diode.

20. A lighting system comprising the light emitting device according to claim 18.

21. An image display unit comprising the light emitting device according to claim 18.

22. The light emitting device according to claim 18, which uses a GaNbased compound semiconductor as the first light emitter.

23. The light emitting device according to claim 18, which emits white light.

24. The light emitting device according to claim 18, which emits red light.

25. A method of producing the phosphor according to claim 1, which comprises preparing a mixture of sources and burning the mixture by heat treatment under a heating atmosphere, wherein the heating atmosphere is a reducing atmosphere.

26. A phosphor-containing resin wherein the phosphor according to claim 1 is dispersed in a resin.

* * * * *